US012602076B2

(12) United States Patent
Kang et al.

(10) Patent No.: US 12,602,076 B2
(45) Date of Patent: Apr. 14, 2026

(54) ELECTRONIC DEVICE COMPRISING HINGE MODULE

(71) Applicant: Samsung Electronics Co., Ltd., Suwon-si (KR)

(72) Inventors: Giuk Kang, Suwon-si (KR); Younghun Kim, Suwon-si (KR); Dongmin Shin, Suwon-si (KR); Jaehun Ko, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 39 days.

(21) Appl. No.: 18/625,684

(22) Filed: Apr. 3, 2024

(65) Prior Publication Data

US 2024/0248514 A1 Jul. 25, 2024

Related U.S. Application Data

(63) Continuation of application No. PCT/KR2022/013128, filed on Sep. 1, 2022.

(30) Foreign Application Priority Data

Oct. 6, 2021 (KR) ........................ 10-2021-0132155

(51) Int. Cl.
*G06F 1/16* (2006.01)
*H05K 5/00* (2025.01)
*H05K 5/02* (2006.01)

(52) U.S. Cl.
CPC .......... *G06F 1/1618* (2013.01); *G06F 1/1652* (2013.01); *G06F 1/1681* (2013.01); *H05K 5/0226* (2013.01)

(58) Field of Classification Search
CPC .... G06F 1/1618; G06F 1/1652; G06F 1/1681; G06F 1/1616; G06F 1/1641; G06F 1/16;
(Continued)

(56) References Cited

U.S. PATENT DOCUMENTS 8,938,856 B1 * 1/2015 Shin ...................... G06F 1/1681
16/365
10,365,691 B2 * 7/2019 Bae ...................... G06F 1/1652
(Continued)

FOREIGN PATENT DOCUMENTS

CN 112911033 A 6/2021
JP 2020-053001 A 4/2020
(Continued)

OTHER PUBLICATIONS

Extended European Search Report dated Dec. 23, 2024, issued in European Application No. 22878731.3-1218.
(Continued)

*Primary Examiner* — Rockshana D Chowdhury
(74) *Attorney, Agent, or Firm* — Jefferson IP Law, LLP

(57) ABSTRACT

An electronic device is provided. The electronic device includes a housing including a first housing and a second housing configured to rotate with respect to the first housing, a display including a first display area disposed on the first housing and a second display area disposed on the second housing, a hinge module connected to the first housing and the second housing, and a hinge cover surrounding at least a portion of the hinge module, wherein the hinge module includes a hinge arm including a first hinge arm connected to the first housing and includes a first slot, and a second hinge arm connected to the second housing and includes a second slot, a shaft structure connected to the hinge cover, the shaft structure including a first shaft structure having at least a portion located within the first slot and providing a first shaft and a second shaft structure having at least a portion located within the second slot and providing a second shaft, and an interlocking structure including a first interlocking member connected to the first housing and including a first gear, and a second interlocking member connected to the second housing and including a second gear
(Continued)

configured to rotate based on the rotation of the first gear, wherein the first hinge arm is configured to slide and rotate with respect to the first shaft based on a folding angle of the electronic device, and wherein the second hinge arm is configured to slide and rotate with respect to the second shaft based on the folding angle of the electronic device.

15 Claims, 19 Drawing Sheets

(58) Field of Classification Search
CPC .. H05K 5/0226; H04M 1/0268; H04M 1/022; H04M 1/0216; F16C 11/04
See application file for complete search history.

(56) References Cited

U.S. PATENT DOCUMENTS

| | | | | |
|---|---|---|---|---|
| 10,775,852 | B2 | 9/2020 | Kim et al. | |
| 10,778,822 | B2 | 9/2020 | Si | |
| 10,824,197 | B1 * | 11/2020 | Hsu | G06F 1/1641 |
| 11,385,686 | B2 * | 7/2022 | Ai | G06F 1/1681 |
| 11,455,017 | B2 * | 9/2022 | Liu | G06F 1/1626 |
| 11,729,932 | B2 * | 8/2023 | Yun | G06F 1/1641 |
| | | | | 361/807 |
| 11,778,764 | B2 * | 10/2023 | Zhang | H05K 5/0226 |
| | | | | 361/807 |
| 12,130,668 | B2 * | 10/2024 | Liu | G09F 9/301 |
| 12,360,574 | B2 * | 7/2025 | Yun | H05K 5/0017 |
| 2013/0021762 | A1 * | 1/2013 | van Dijk | G09F 9/301 |
| | | | | 361/749 |
| 2015/0013107 | A1 * | 1/2015 | Shin | E05D 3/06 |
| | | | | 16/366 |
| 2015/0366089 | A1 | 12/2015 | Park et al. | |
| 2016/0295709 | A1 * | 10/2016 | Ahn | H04M 1/022 |
| 2017/0115701 | A1 * | 4/2017 | Bae | G06F 1/16 |
| 2017/0115791 | A1 | 4/2017 | Sheik-Nainar et al. | |
| 2018/0246355 | A1 | 8/2018 | Dighde et al. | |
| 2019/0094917 | A1 | 3/2019 | Schmelzle et al. | |
| 2020/0166974 | A1 * | 5/2020 | Ai | G06F 1/1681 |
| 2020/0267858 | A1 | 8/2020 | Kim et al. | |
| 2020/0348732 | A1 | 11/2020 | Kang et al. | |
| 2020/0363843 | A1 | 11/2020 | Cheng | |
| 2021/0034116 | A1 | 2/2021 | Torres et al. | |
| 2021/0165466 | A1 | 6/2021 | Kang et al. | |
| 2023/0180409 | A1 * | 6/2023 | Park | G06F 1/1681 |
| | | | | 361/679.01 |
| 2024/0248514 | A1 * | 7/2024 | Kang | G06F 1/1618 |

FOREIGN PATENT DOCUMENTS

| | | | |
|---|---|---|---|
| KR | 10-2016-0144299 | A | 12/2016 |
| KR | 10-2019-0097898 | A | 8/2019 |
| KR | 10-2019-0124752 | A | 11/2019 |
| KR | 10-2020-0101229 | A | 8/2020 |
| KR | 10-2020-0126524 | A | 11/2020 |
| KR | 10-2021-0009574 | A | 1/2021 |
| KR | 10-2021-0068880 | A | 6/2021 |

OTHER PUBLICATIONS

International Search Report dated Dec. 13, 2022, issued in International Patent Application No. PCT/KR2022/013128.
Korean Office Action dated Jan. 15, 2026, issued in Korean Patent Application No. 10-2021-0132155.

* cited by examiner

200

420

421        422

421    d5    422 d6

ELECTRONIC DEVICE COMPRISING HINGE MODULE

CROSS-REFERENCE TO RELATED APPLICATION(S)

This application is a continuation application, claiming priority under § 365(c), of an International application No. PCT/KR2022/013128, filed on Sep. 1, 2022, which is based on and claims the benefit of a Korean patent application number 10-2021-0132155, filed on Oct. 6, 2021, in the Korean Intellectual Property Office, the disclosure of each of which is incorporated by reference herein in its entirety.

BACKGROUND

1. Field

The disclosure relates to an electronic device including a hinge module.

2. Description of Related Art

Due to the advancement of information and communication technology and semiconductor technology, various functions are being integrated into a single portable electronic device. For example, electronic devices may implement not only communication functions, but also entertainment functions, such as games, multimedia functions, such as music/video playback, communication and security functions for mobile banking, and functions for schedule management and an electronic wallet. These electronic devices are being miniaturized to be conveniently carried by users. As mobile communication services expand into the multimedia service area, the size of the display of electronic devices needs to be increased to allow users to fully utilize multimedia services as well as voice calls and short messages. However, the size of the display of an electronic device is in a trade-off relationship with the miniaturization of the electronic device.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic device comprising hinge module.

Additional aspects will be set forth in part in the description which follows and, in part, will be apparent from the description, or may be learned by practice of the presented embodiments.

In accordance with an aspect of the disclosure, an electronic device is provided. The electronic device includes a housing including a first housing and a second housing configured to rotate relative to the first housing, a display including a first display area disposed on the first housing, and a second display area disposed on the second housing, a hinge module connected to the first housing and the second housing, and a hinge cover configured to surround at least a portion of the hinge module, wherein the hinge module includes a hinge arm including a first hinge arm connected to the first housing and including a first slot and a second hinge arm connected to the second housing and including a second slot, a shaft structure connected to the hinge cover, the shaft structure including a first shaft structure at least partially located within the first slot and providing a first axis, and a second shaft structure at least partially located within the second slot and providing a second axis, and an interlocking structure including a first interlocking member connected to the first housing and including a first gear and a second interlocking member connected to the second housing and including a second gear configured to rotate based on the rotation of the first gear, wherein the first hinge arm is configured to slide and rotate about the first axis, based on a folding angle of the electronic device, and wherein the second hinge arm is configured to slide and rotate about the second axis, based on the folding angle of the electronic device.

In accordance another aspect of the disclosure, the hinge module is provided. The hinge module includes a hinge arm including a first hinge arm including a first slot, and a second hinge arm including a second slot, an interlocking structure including a first interlocking member including a first gear, and a second interlocking member including a second gear configured to rotate based on rotation of the first gear, and a shaft structure including a first shaft structure at least partially located within the first slot, a second shaft structure at least partially located within the second slot, a third shaft structure connected to the first interlocking member, and a fourth shaft structure connected to the second interlocking member, wherein the first hinge arm is configured to slide and rotate with respect to the first shaft structure, and the second hinge arm is configured to slide and rotate with respect to the second shaft structure.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It should be appreciated that the blocks in each flowchart and combinations of the flowcharts may be performed by one or more computer programs which include computer-executable instructions. The entirety of the one or more computer programs may be stored in a single memory device or the one or more computer programs may be divided with different portions stored in different multiple memory devices.

Any of the functions or operations described herein can be processed by one processor or a combination of processors. The one processor or the combination of processors is circuitry performing processing and includes circuitry like an application processor (AP, e.g., a central processing unit (CPU)), a communication processor (CP, e.g., a modem), a graphical processing unit (GPU), a neural processing unit (NPU) (e.g., an artificial intelligence (AI) chip), a wireless-fidelity (Wi-Fi) chip, a Bluetooth™ chip, a global positioning system (GPS) chip, a near field communication (NFC)

chip, connectivity chips, a sensor controller, a touch controller, a finger-print sensor controller, a display drive integrated circuit (IC), an audio CODEC chip, a universal serial bus (USB) controller, a camera controller, an image processing IC, a microprocessor unit (MPU), a system on chip (SoC), an IC, or the like.

Figure 1:
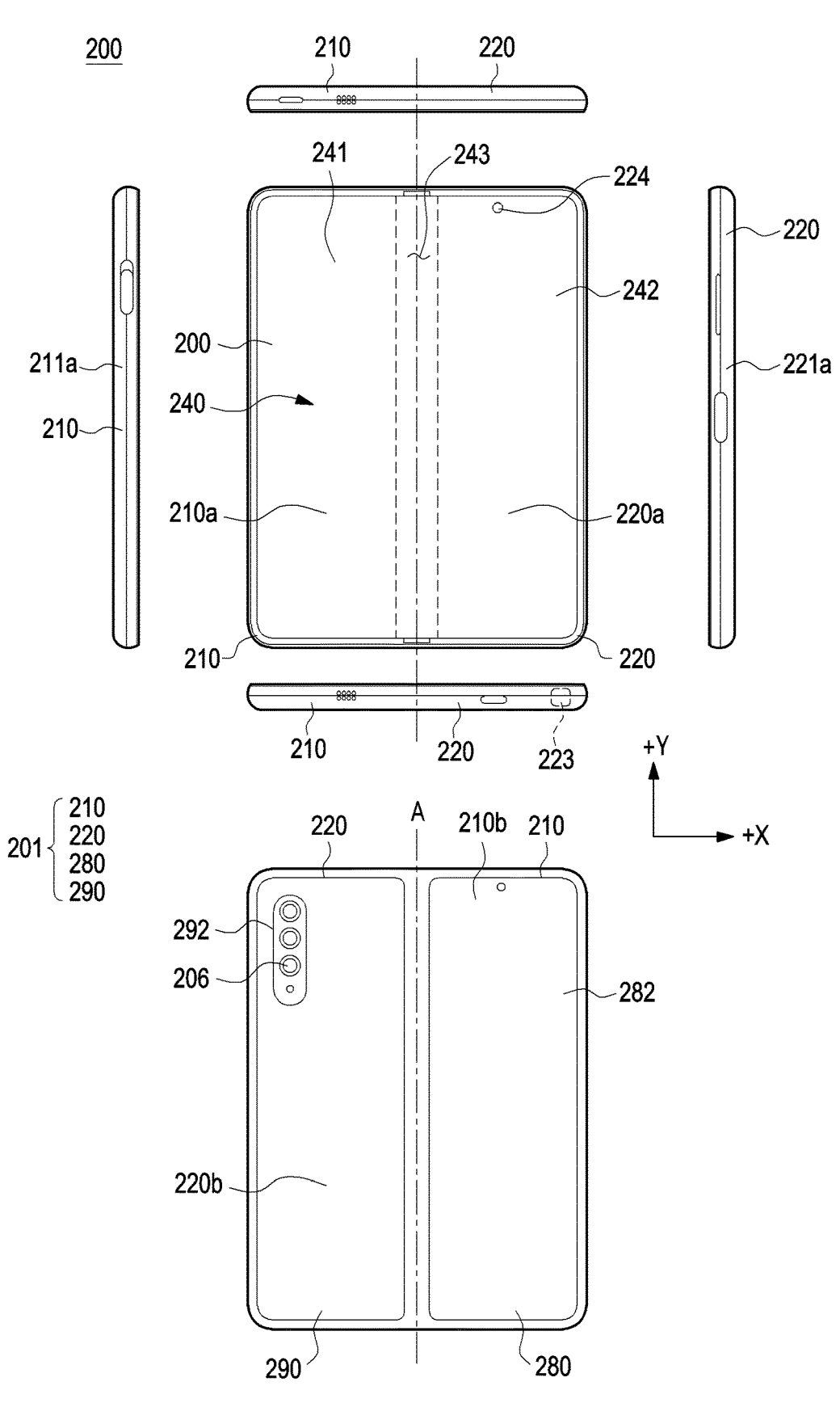
FIG. 1 illustrates an unfolded state of an electronic device according to an embodiment of the disclosure.

FIG. 1 illustrates an unfolded state of an electronic device according to an embodiment of the disclosure.

Figure 2:
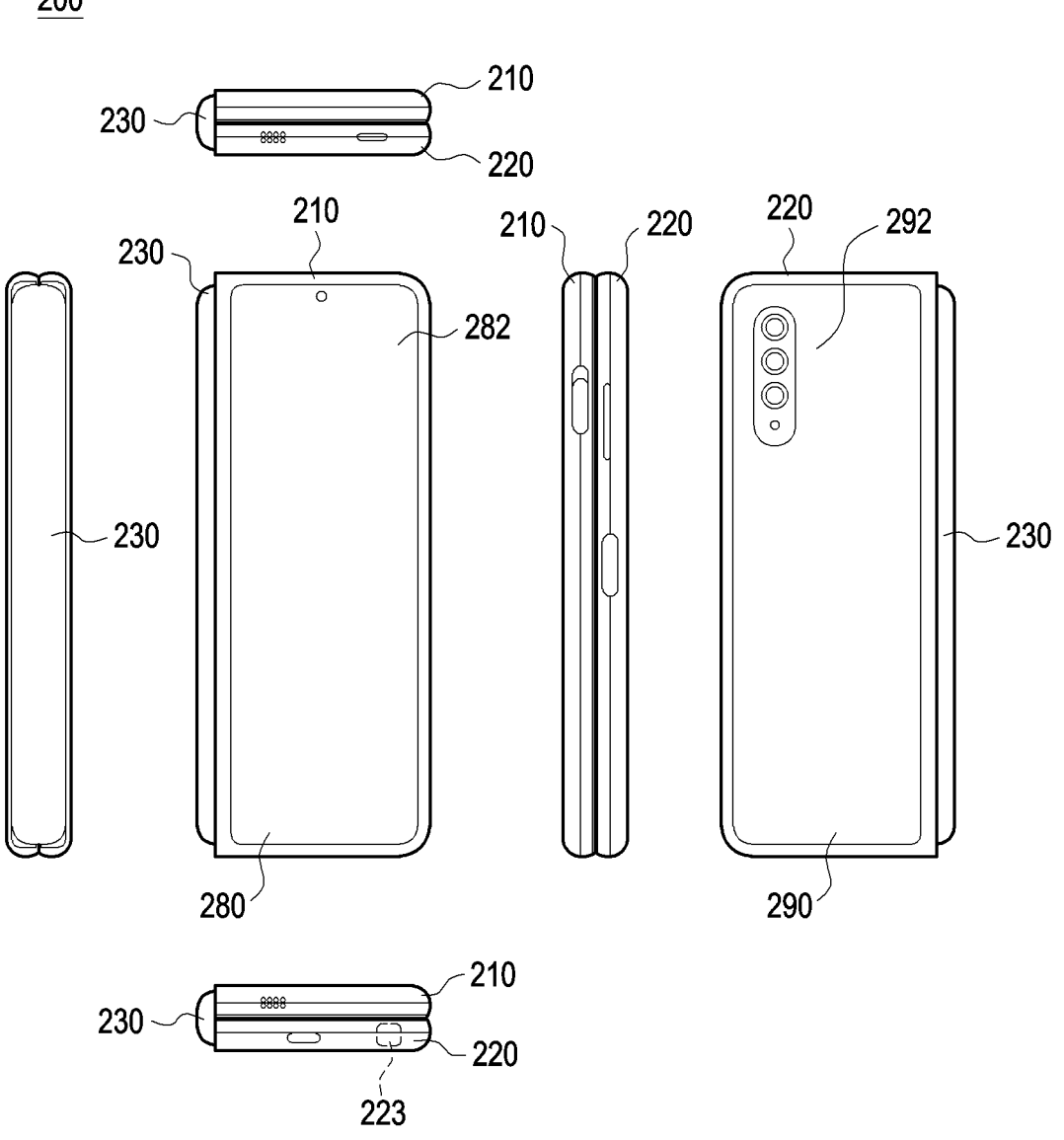
FIG. 2 illustrates a folded state of an electronic device according to an embodiment of the disclosure.

FIG. 2 illustrates a folded state of an electronic device according to an embodiment of the disclosure.

Referring to FIGS. 1 and 2, an electronic device 200 according to an embodiment may include a housing 201, a hinge cover 230 that covers a foldable portion of the housing 201, and a display 240 disposed in a space formed by the housing 201. According to an embodiment of the disclosure, the surface on which the display 240 is placed is defined as a front surface (e.g., a first front surface 210a and a second front surface 220a) of the electronic device 200. In addition, the surface opposite to the front surface is defined as a rear surface (e.g., a first rear surface 210b and a second rear surface 220b) of the electronic device 200. In addition, the surface surrounding the space between the front surface and the rear surface is defined as a later surface (e.g., a first lateral surface 211a and a second lateral surface 221a) of the electronic device 200.

According to an embodiment of the disclosure, the housing 201 may include a first housing 210, a second housing 220 rotatable with respect to the first housing 210, a first rear cover 280, and a second rear cover 290. The housing 201 of the electronic device 200 is not limited to the shape and combination shown in FIGS. 1 and 2, and may be implemented in other shapes or by combining and/or coupling other parts. For example, in another embodiment of the disclosure, the first housing 210 and the first rear cover 280 may be integrally formed with each other, and the second housing 220 and the second rear cover 290 may be integrally formed with each other. According to various embodiments of the disclosure, the first housing 210 may be connected to a hinge module 202 and include the first front surface 210a facing a first direction, and the first rear surface 210b facing a second direction opposite to the first direction. The second housing 220 may be connected to the hinge module 202, include the second front surface 220a facing a third direction, and the second rear surface 220b facing a fourth direction opposite to the third direction, and rotate with respect to the first housing 210 about the hinge module 202. Accordingly, the electronic device 200 may transition to a folded state or an unfolded state. In a folded state, the first front surface 210a of the electronic device 200 may face the second front surface 220a, and in an unfolded state, the third direction may be same to the first direction. Unless otherwise stated, the direction will be described based on the unfolded state of the electronic device 200.

According to an embodiment of the disclosure, the first housing 210 and the second housing 220 may be disposed on the opposite sides with the folding axis (A) therebetween and may have an overall symmetrical shape with respect to the folding axis (A). As will be described later, the first housing 210 and the second housing 220 may form different angle or distance depending on whether the electronic device 200 is in an unfolded state, a folded state, or an intermediate state. According to an embodiment of the disclosure, the second housing 220, unlike the first housing 210, may further include a sensor area 224 in which various sensors (e.g., front cameras) are placed, but may have, in the other area, a mutually symmetrical shape. According to an embodiment of the disclosure, the folding axis (A) may be multiple (e.g., two) parallel folding axes. In the disclosure, the folding axis (A) may be provided along the longitudinal direction (Y-axis direction) of the electronic device 200, but the direction of the folding axis (A) is not limited thereto. For example (not shown), the electronic device 200 may include a folding axis (A) extending along the width direction (e.g., X-axis direction).

According to an embodiment of the disclosure, the electronic device 200 may include a structure into which a digital pen is insertable. For example, a hole 223 into which the digital pen is insertable may be disposed on the lateral surface of the first housing 210 or the second housing 220 of the electronic device 200.

According to various embodiments of the disclosure, at least a portion of the first housing 210 and the second housing 220 may be formed of a metal material or a non-metallic material having a selected level of rigidity to support the display 240. At least a portion formed of the metal material may provide a ground plane of the electronic device 200 and may be electrically connected to a ground line disposed on a printed circuit board (e.g., the substrate 260 of FIG. 3).

According to various embodiments of the disclosure, the sensor area 224 may be disposed adjacent to one corner of the second housing 220 to have a predetermined area. However, the arrangement, shape, and size of the sensor area 224 are not limited to the illustrated example. For example, in other embodiments of the disclosure, the sensor area 224 may be provided in an area in another corner or between the top and bottom corners of the second housing 220 or in the first housing 210. In an embodiment of the disclosure, components built in the electronic device 200 for performing various functions may be exposed from the front surface of the electronic device 200 through the sensor area 224 or through one or more openings provided in the sensor area 224. In various embodiments of the disclosure, the components may include various types of sensors. The sensor may include, for example, at least one of a front camera, a receiver, or a proximity sensor.

According to various embodiments of the disclosure, the first rear cover 280 may be disposed on one side of the folding axis (A) on the rear surface of the electronic device 200 and have, for example, a substantially rectangular periphery. The periphery may be wrapped by the first housing 210. Similarly, the second rear cover 290 may be disposed on the other side of the folding axis (A) on the rear surface of the electronic device 200, and the periphery thereof may be wrapped by the second housing 220.

According to various embodiments of the disclosure, the first rear cover 280 and the second rear cover 290 may have a substantially symmetrical shape about the folding axis (A-axis). However, the first rear cover 280 and the second rear cover 290 may not necessarily have mutually symmetrical shapes, and in another embodiment of the disclosure, the electronic device 200 may include the first rear cover 280 and the second rear cover 290 of various shapes.

According to various embodiments of the disclosure, the first rear cover 280, the second rear cover 290, the first housing 210, and the second housing 220 may form a space allowing various components of the electronic device 200 (e.g., a printed circuit board or battery) to be placed therein. According to an embodiment of the disclosure, one or more components may be placed or visually exposed on the rear surface of the electronic device 200. For example, at least a portion of the sub-display (e.g., a sub-display 244 of FIG. 3) may be visually exposed through a first rear area 282 of the first rear cover 280. In another embodiment of the disclosure, one or more components or sensors may be visually exposed through a second rear area 292 of the second rear cover 290. In various embodiments of the disclosure, the sensor may include a proximity sensor and/or a camera module 206 (e.g., a rear camera).

According to various embodiments of the disclosure, the front camera exposed from the front surface of the electronic device 200 through one or more openings provided in the sensor area 224 or the camera module 206 exposed through the second rear area 292 of the second rear cover 290 may include one or more lenses, an image sensor, and/or an image signal processor. In some embodiments of the disclosure, two or more lenses (an infrared camera, a wide-angle, and a telephoto lens) and image sensors may be placed on one surface of the electronic device 200.

Figure 3:
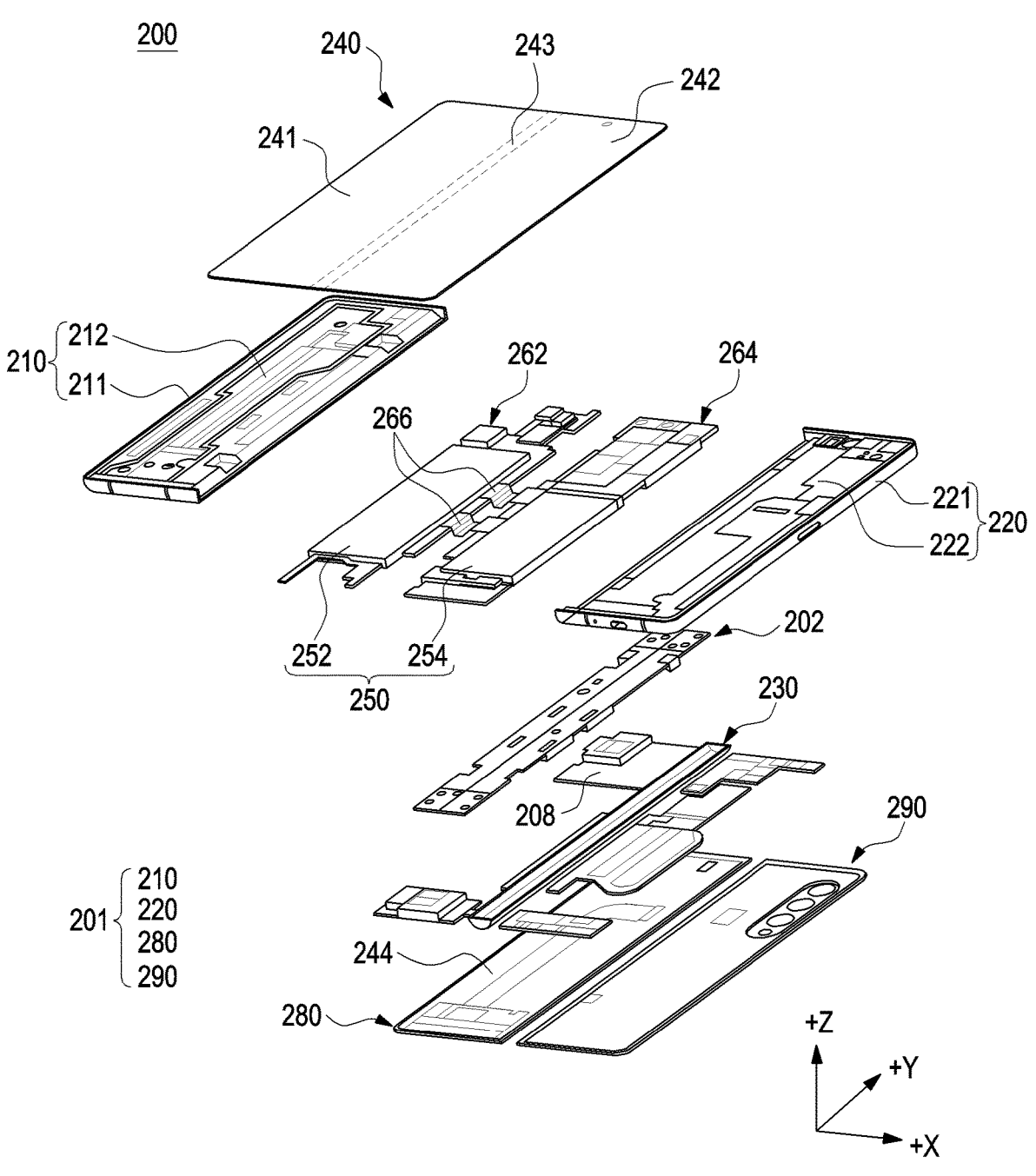
FIG. 3 is an exploded perspective view of an electronic device according to an embodiment of the disclosure.

Referring to FIG. 2, the hinge cover 230 may be disposed between the first housing 210 and the second housing 220 and cover internal components (e.g., the hinge module 202 of FIG. 3). According to an embodiment of the disclosure, the hinge cover 230 may be covered by a portion of the first housing 210 and the second housing 220 or be exposed to the outside depending on the state (a flat state or a folded state) of the electronic device 200.

According to an embodiment of the disclosure, as shown in FIG. 1, when the electronic device 200 is in an unfolded state, the hinge cover 230 may be covered and unexposed by the first housing 210 and the second housing 220. As another example, as shown in FIG. 2, when the electronic device 200 is in a folded state (e.g., a fully folded state), the hinge cover 230 may be exposed to the outside through a space between the first housing 210 and the second housing 220. As still another example, in an intermediate state in which the first housing 210 and the second housing 220 are folded with a certain angle, the hinge cover 230 may be partially exposed to the outside through a space between the first housing 210 and the second housing 220. However, in this case, the exposed area may be smaller than the area exposed in the fully folded state. In an embodiment of the disclosure, the hinge cover 230 may include a curved surface.

According to various embodiments of the disclosure, the display 240 may be placed in the space formed by the housing 201. For example, the display 240 may be stably placed in a recess formed by the housing 201 and may constitute most of the front surface of the electronic device 200. Accordingly, the front surface of the electronic device 200 may include the display 240, a partial area of the first housing 210 adjacent to the display 240, and a partial area of the second housing 220. In addition, the rear surface of the electronic device 200 may include the first rear cover 280, a partial area of the first housing 210 adjacent to the first rear cover 280, the second rear cover 290, and a partial area of the second housing 220 adjacent to the second rear cover 290.

According to an embodiment of the disclosure, the display 240 may include a plurality of displays spaced apart from each other. For example, the display 240 may include a first display area 241 disposed on the first housing 210, and a second display area 242 disposed on the second housing 220. A folding area 243 shown in FIGS. 1 and/or 3 may be excluded. According to an embodiment of the disclosure, the first display area 241 and the second display area 242 may be rigid displays spaced apart from each other. For example, the display 240 may be interpreted as a dual display. According to an embodiment of the disclosure, the first display area 241 and the second display area 242 may rotate about the folding axis (A).

According to an embodiment of the disclosure, the display 240 may refer to a display having at least a partial area deformable into a flat or curved surface. For example, the display 240 may be a foldable or flexible display. According to an embodiment of the disclosure, the display 240 may include the folding area 243, the first display area 241 disposed on one side (e.g., the left side of the folding area 243 shown in FIG. 1), with respect to the folding area 243, and the second display area 242 disposed on the other side (e.g., the right side of the folding area 243 shown in FIG. 1) with respect to the folding area 243. However, the division of the areas of the display 240 is an example, and the display 240 may be divided into a plurality of areas (for example, four or more or two) depending on the structure or function thereof. For example, in the embodiment shown in FIG. 1, the area of the display 240 may be divided by the folding area 243 or the folding axis (A-axis) extending parallel to the Y-axis, but in another embodiment of the disclosure, the area of the display 240 may be divided based on a different folding area (e.g., a folding area parallel to the X-axis) or a different folding axis (e.g., a folding axis parallel to the X-axis). According to an embodiment of the disclosure, the display 240 may be combined with or be disposed adjacent to a touch detection circuit, a pressure sensor capable of measuring the intensity (pressure) of touch, and/or a digitizer (not shown) configured to detect a magnetic field-type stylus pen.

According to various embodiments of the disclosure, the first display area 241 and the second display area 242 may have an overall symmetrical shape with respect to the folding area 243. According to one embodiment (not shown), the second display area 242, unlike the first display area 241, may include a notch cut according to the presence of the sensor area 224, but may have, in the other area, a symmetrical shape with the first display area 241. In other words, the first display area 241 and the second display area 242 may include a portion having a symmetrical shape, and a portion having an asymmetrical shape.

Hereinafter, the operation of the first housing 210 and the second housing 220 according to the state (e.g., a flat state or unfolded state and a folded state) of the electronic device 200 and each area of the display 240 will be described.

According to various embodiments of the disclosure, when the electronic device 200 is in a flat state (e.g., FIG. 1), the first housing 210 and the second housing 220 may substantially form an angle of 180 degrees and disposed to face the same direction. The surface of the first display area 241 and the surface of the second display area 242 of the display 240 may form an angle of 180 degrees to each other and may face the same direction (e.g., the front direction of the electronic device). The folding area 243 may form the same plane as the first display area 241 and the second display area 242.

According to various embodiments of the disclosure, when the electronic device 200 is in a folded state (e.g., FIG. 2), the first housing 210 and the second housing 220 may be arranged to face each other. The surface of the first display area 241 and the surface of the second display area 242 of the display 240 may form a narrow angle (e.g., between 0 degrees and 10 degrees) and may face each other. At least a portion of the folding area 243 may be formed of a curved surface having a predetermined curvature.

According to various embodiments of the disclosure, when the electronic device 200 is in an intermediate state (not shown), the first housing 210 and the second housing 220 may be disposed at a certain angle to each other. The surface of the first display area 241 and the surface of the second display area 242 of the display 240 may form an angle that is larger than the angle in the folded state and smaller than the angle in the unfolded state. At least a portion of the folding area 243 may formed of a curved surface having a predetermined curvature, and the curvature at this time may be smaller than that in the folded state.

FIG. 3 is an exploded perspective view of an electronic device according to an embodiment of the disclosure.

Referring to FIG. 3, the electronic device 200 may include the housing 201, the display 240, the hinge module 202, a battery 250, and a substrate 260.

According to an embodiment of the disclosure, the housing 201 may include the first housing 210, the second housing 220, the first rear cover 280, and the second rear cover 290. The configuration of FIG. 3, including the first housing 210, the second housing 220, the hinge cover 230, the first rear cover 280, and the second rear cover 290 may be partially or entirely the same as those of FIGS. 1 and/or 2, including the first housing 210, the second housing 220, the hinge cover 230, the first rear cover 280, and the second rear cover 290.

According to various embodiments of the disclosure, the first housing 210 and the second housing 220 may be assembled to each other or be coupled to both sides of the hinge module 202. According to an embodiment of the disclosure, the first housing 210 may include a first support area 212 capable of supporting components (e.g., the first circuit board 262 and/or the first battery 252) of the electronic device 200, and a first side wall 211 surrounding at least a portion of the first support area 212. The first side wall 211 may include a first lateral surface (e.g., the first lateral surface 211a of FIG. 2) of the electronic device 200. According to an embodiment of the disclosure, the second housing 220 may include a second support area 222 capable of supporting components (e.g., the second circuit board 264 and/or the second battery 254) of the electronic device 200, and a second side wall 221 surrounding at least a portion of the second support area 222. The second side wall 221 may include a second lateral surface (e.g., the second lateral surface 221a of FIG. 2) of the electronic device 200.

According to an embodiment of the disclosure, the display 240 may include the first display area 241, the second display area 242, the folding area 243, and a sub-display 244. The configuration of FIG. 3, including the first display area 241, the second display area 242, and the folding area 243 may be partially or entirely the same as those of FIGS. 1 and/or 2, including the first display area 241, the second display area 242, and the folding area 243.

According to an embodiment of the disclosure, the sub-display 244 may display a screen in a different direction from the display areas 241 and 242. For example, the sub-display 244 may output a screen in a direction opposite to the first display area 241. According to an embodiment of the disclosure, the sub-display 244 may be disposed on the first rear cover 280.

According to an embodiment of the disclosure, the battery 250 may include a first battery 252 disposed in the first housing 210 and a second battery 254 disposed in the second housing 220. According to an embodiment of the disclosure, the first battery 252 may be disposed on the first circuit board 262, and the second battery 254 may be disposed on the second circuit board 264. According to an embodiment of the disclosure, the battery 250 may supply power to at least one component of the electronic device 200. According to an embodiment of the disclosure, the battery 250 may include, for example, a non-rechargeable primary battery, a rechargeable secondary battery, or a fuel cell.

According to an embodiment of the disclosure, the substrate 260 may include the first circuit board 262 disposed in the first housing 210 and the second circuit board 264 disposed in the second housing 220. According to an embodiment of the disclosure, the substrate 260 may include at least one flexible circuit board 266 configured to electrically connect the first circuit board 262 and the second circuit board 264. According to an embodiment of the disclosure, at least a portion of flexible circuit board 266 may be disposed across hinge module 202. According to an embodiment of the disclosure, the first circuit board 262 and the second circuit board 264 may be disposed inside the space formed by the first housing 210, the second housing 220, the first rear cover 280, and the second rear cover 290. Components for implementing various functions of the electronic device 200 may be disposed on the first circuit board 262 and the second circuit board 264.

According to an embodiment of the disclosure, the electronic device 200 may include a speaker module 208. According to an embodiment of the disclosure, the speaker module 208 may convert electrical signals into sound. According to an embodiment of the disclosure, the speaker module 208 may be disposed inside the space formed by the first housing 210, the second housing 220, the first rear cover 280, and the second rear cover 290. According to an embodiment of the disclosure, the speaker module 208 may convert electrical signals into sound.

In the detailed description below, a configuration in which a pair of housings (or, referred to as "housing") are rotatably coupled by a hinge module (or, referred to as "hinge structure") may be exemplified. However, these embodiments do not limit the electronic devices according to the various embodiments disclosed in the disclosure. For example, an electronic device according to various embodiments disclosed in the disclosure may include three or more housings, and "a pair of housings" in the embodiments disclosed below may mean "two housing rotatably coupled to each other, among the three or more housings.

Figure 4:
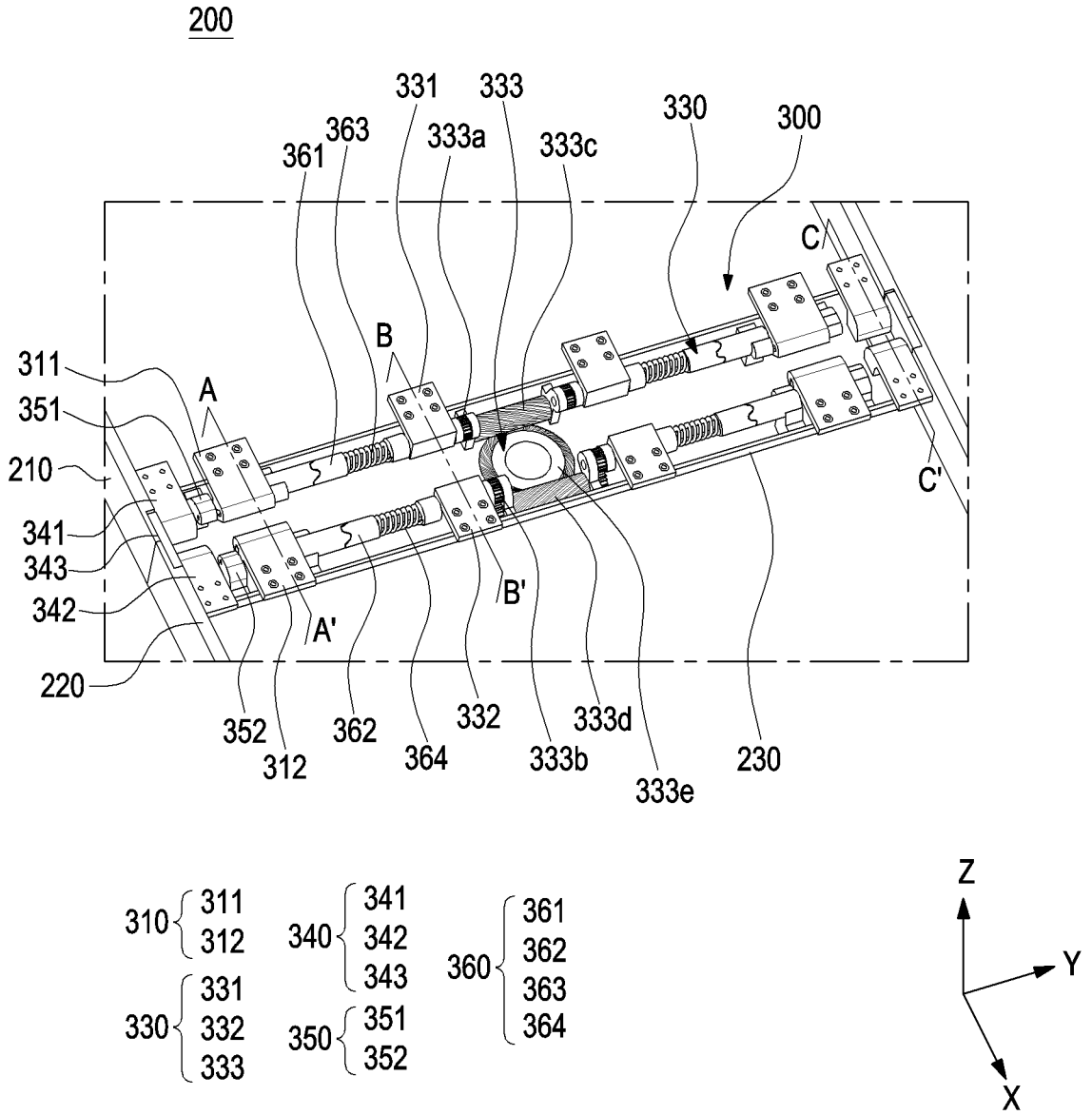
FIG. 4 is a perspective view of an electronic device, showing a hinge module connected to a housing, according to an embodiment of the disclosure.

FIG. 4 is a perspective view of an electronic device, showing a hinge module connected to a housing, according to an embodiment of the disclosure.

Figure 5:
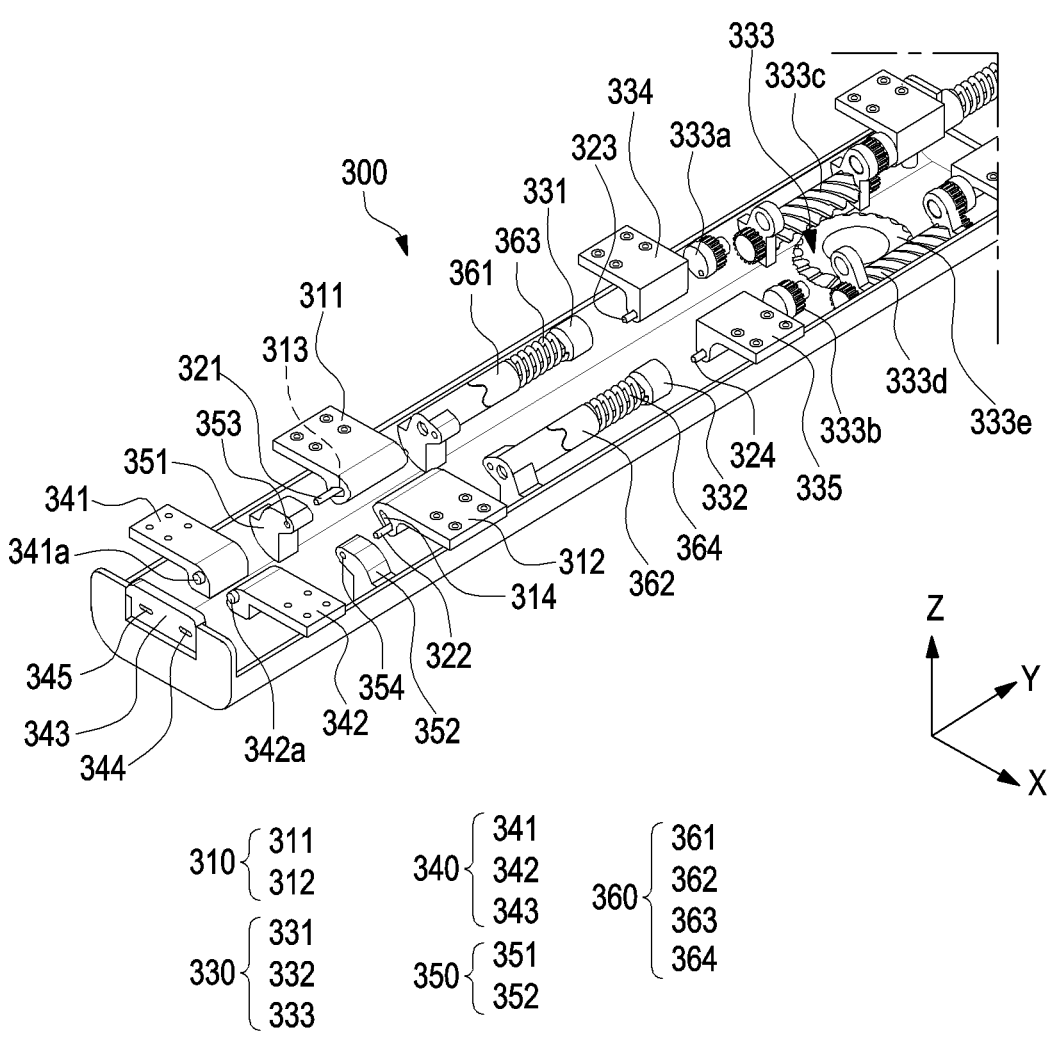
FIG. 5 is an exploded perspective view of a hinge module and a hinge cover according to an embodiment of the disclosure.

FIG. 5 is an exploded perspective view of a hinge module and a hinge cover according to an embodiment of the disclosure.

Referring to FIGS. 4 and/or 5, the electronic device 200 may include the first housing 210, the second housing 220, the hinge cover 230, and the hinge module 300. The configurations of FIGS. 4 and/or 5, including the first housing 210, the second housing 220, the hinge cover 230, and the hinge module 300 may be partially or entirely the same as that of FIG. 3, including the first housing 210, the second housing 220, the hinge cover 230, and the hinge module 202.

According to an embodiment of the disclosure, the hinge module 300 may include a hinge arm 310, a shaft structure 320, an interlocking structure 330, a rotation structure 340, a connection structure 350, and/or a fixing structure 360. According to an embodiment (not shown), the components of the hinge module 300 may have at least one (e.g., the rotation structure 340) excluded therefrom.

According to an embodiment of the disclosure, the hinge module 300 may be connected to the first housing 210 and the second housing 220. For example, the first housing 210 may rotate relative to the second housing 220 by using the hinge module 300.

According to an embodiment of the disclosure, the hinge arm 310 may substantially implement or guide the rotational movement of the first housing 210 and/or the second housing 220. According to an embodiment of the disclosure, hinge arms 311 and 312 may rotate while connected to the housings 210 and 220. According to an embodiment of the disclosure, the hinge arm 310 may include a first hinge arm 311 connected to the first housing 210, and a second hinge arm 312 connected to the second housing 220.

According to an embodiment of the disclosure, the hinge arm 310 may accommodate at least a portion of the shaft structure 320. For example, the first hinge arm 311 may include a first slot 313 that receives at least a portion of the first shaft structure 321. The second hinge arm 312 may include a second slot 314 that receives at least a portion of a second shaft structure 322. According to an embodiment of the disclosure, the first slot 313 and/or the second slot 314 may be interpreted as a through-hole or groove extending in one direction. According to an embodiment of the disclosure, the first hinge arm 311a may slide and rotate within the first slot 313, based on the folding of the electronic device 200, and the second hinge arm 311b may slide within the second slot 314, based on the folding of the electronic device 200. According to an embodiment of the disclosure, the folding of the electronic device 200 may be interpreted as a change in the angle between the first display area (e.g., the first display area 241 of FIG. 1) and the second display area (e.g., the second display area 242 of FIG. 1) of the electronic device 200.

Figure 6A:
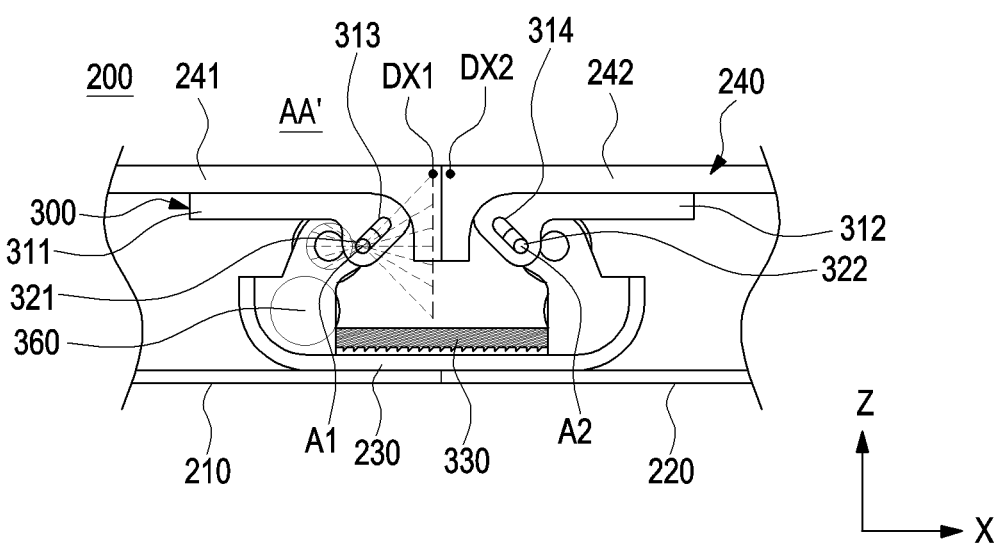
FIGS. 6A, 6B, and 6C are sectional views, taken along line A-A' of FIG. 4 according to various embodiments of the disclosure.
Figure 7A:
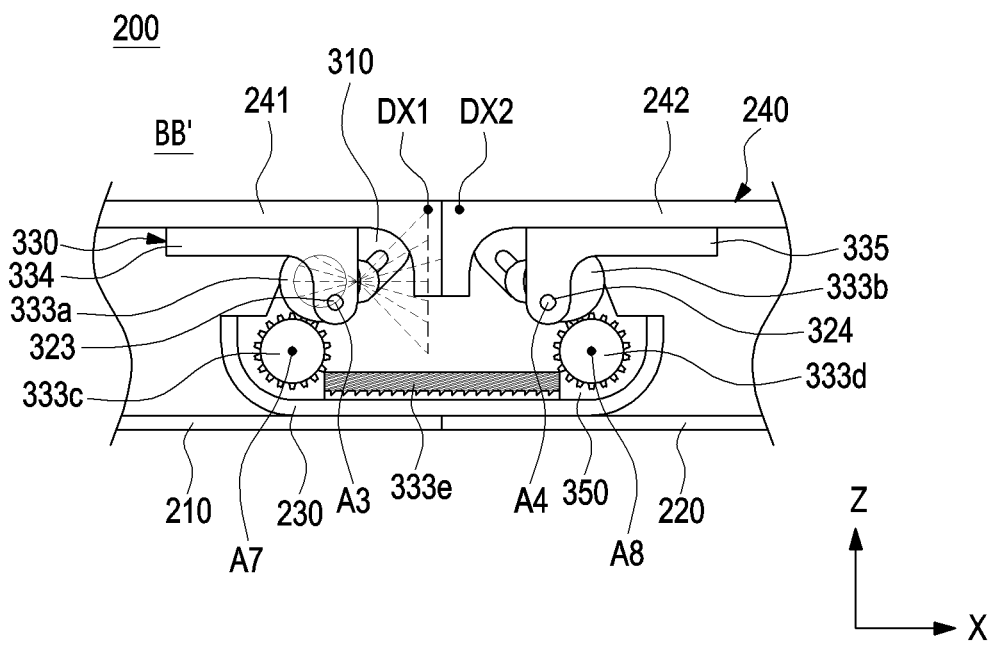
FIGS. 7A, 7B, and 7C are perspective views, taken along line B-B' of FIG. 4 according to various embodiments of the disclosure.

According to an embodiment of the disclosure, the shaft structure 320 may provide a rotational axis (e.g., a first axis (A1) and a second axis (A2) of FIG. 6A and/or a third axis (A3) and a fourth axis (A4) of FIG. 7A) to a component (e.g., the hinge arm 310 and/or the interlocking structure 330) of the hinge module 300. According to an embodiment of the disclosure, the shaft structure 320 may include a first shaft structure 321 providing a first axis (A1) and a second shaft structure 322 providing a second axis (A2) parallel to the first axis (A1). According to an embodiment of the disclosure, the first shaft structure 321 may be connected to a first connection member 351 and/or the first cam member 351, and the second shaft structure 322 may be connected to a second connection member 352 and/or the second cam member 352. According to an embodiment of the disclosure, the first shaft structure 321 may be located within the first slot 313 of the first hinge arm 311. The second shaft structure 322 may be located within the second slot 314 of the second hinge arm 312. For example, the first hinge arm 311 may slide with respect to the first shaft structure 321 while rotating about the first shaft structure 321. The second hinge arm 312 may slide with respect to the second shaft structure 322 while rotating about the second shaft structure 322. According to an embodiment of the disclosure, the shaft structure 320 may include a third shaft structure 323 providing the third axis (A3) and a fourth shaft structure 324 providing the fourth axis (A4). According to an embodiment of the disclosure, the third shaft structure 323 may be connected to a first rotation plate 334, and the fourth shaft structure 324 may be connected to a second rotation plate 335. For example, at least a portion (e.g., the first rotation plate 334) of a first interlocking member 331 may be connected to a first gear 333a and/or a third gear 333c by using the third shaft structure 323. The first interlocking member 331 may rotate about the center (e.g., a seventh axis (A7) of FIG. 7A) of the third gear 333c. At least a portion (e.g., the second plate 335) of a second interlocking member 332 may be connected to a second gear 333b and/or a fourth gear 333d by using the fourth shaft structure 324. The second interlocking member 332 may rotate about the center (e.g., an eighth axis (A8) of FIG. 7B) of the fourth gear 333*d*. According to an embodiment of the disclosure, one end of the third shaft structure 323 may be connected to the first interlocking member 331, and the other end may be connected to the first gear 333*a*. The first rotation plate 334 may be connected to the third shaft structure 323 while located between the first interlocking member 331 and the first gear 333*a*. According to an embodiment of the disclosure, one end of the fourth shaft structure 324 may be connected to the second interlocking member 332, and the other end may be connected to the second gear 333*b*. The second rotation plate 335 may be connected to the fourth shaft structure 324 while located between the second interlocking member 332 and the second gear 333*b*.

According to an embodiment of the disclosure, the interlocking structure 330 may interlock the rotation of the first housing 210 with the rotation of the second housing 220. According to an embodiment of the disclosure, the interlocking structure 330 may include a first interlocking member 331 connected to the first housing 210 and a second interlocking member 332 connected to the second housing 220. For example, the first interlocking member 331 may include a first rotation plate 334 connected to the first housing 210. The second interlocking member 332 may include a second rotation plate 335 connected to the first housing 210. According to an embodiment of the disclosure, the interlocking structure 330 may rotate the second housing 220, by using a gear assembly 333 connected to the interlocking members 331 and 332, by an angle substantially equal to the angle at which the first housing 210 rotates.

According to an embodiment of the disclosure, the gear assembly 333 may include a first gear 333*a* connected to the first interlocking member 331 and a second gear 333*b* connected to the second interlocking member 332. The first gear 333*a* may rotate based on the rotation of the second gear 333*b*. For example, the gear assembly 333 may include a third gear 333*c* meshed with the first gear 333*a*, a fourth gear 333*d* meshed with the second gear 333*b*, a third gear 333*c*, and a fifth gear 333*e* connected to the fourth gear 333*d*. According to an embodiment of the disclosure, the third gear 333*c*, the fourth gear 333*d*, and/or the fifth gear 333*e* may be helical gears. According to an embodiment of the disclosure, the arrangement space inside the electronic device (e.g., the electronic device 200 of FIG. 1) in which at least a portion of the gear assembly 333 is a helical gear may be larger than the arrangement space inside the electronic device (not shown) in which the gear assembly 333 is a spur gear. According to an embodiment (not shown), the fifth gear 333*e* may be an idle gear including a plurality (e.g., two) of gears.

According to an embodiment of the disclosure, the rotation structure 340 may substantially implement or guide the rotational motion of the first housing 210 and/or the second housing 220. According to an embodiment of the disclosure, the rotation structure 340 may include rotation members 341 and 342 and a rotation bracket 343.

According to an embodiment of the disclosure, the rotation members 341 and 342 may rotate with respect to the rotation bracket 343 while connected to the housings 210 and 220. According to an embodiment of the disclosure, the rotation members 341 and 342 may include the second housing 220 connected to the first housing 210 and the rotation bracket 343, and the second rotation member 342 connected to the rotation bracket 343. According to an embodiment of the disclosure, the first rotation member 341 may include a first protruding area 341*a* inserted into a third slot 344 of the rotation bracket 343. The second rotation member 342 may include a second protruding area 342*a* inserted into a fourth slot 345 of the rotation bracket 343. According to an embodiment of the disclosure, the first protruding area 341*a* may slide within the third slot 344, based on the folding of the electronic device 200, and the second protruding area 342*a* may slide within the fourth slot 345, based on the folding of the electronic device 200. According to an embodiment of the disclosure, the first protruding area 341*a* may provide a fifth axis (e.g., a fifth axis (A5) of FIG. 9A), and the second protruding area 342*a* may provide a sixth axis (e.g., a sixth axis (A6) of FIG. 9A) substantially parallel to the fifth axis (A5). According to an embodiment of the disclosure, the first rotation member 341 may slide within the third slot 344 while rotating about the fifth axis (A5). The second rotation member 342 may slide within the fourth slot 345 while rotating about the sixth axis (A6).

According to an embodiment of the disclosure, the rotation bracket 343 may accommodate the first rotation member 341 and the second rotation member 342. The rotation bracket 343 may include the third slot 344 that accommodates at least a portion (e.g., the first protruding area 341*a*) of the first rotation member 341, and the fourth slot 345 that accommodates at least a portion (e.g., the second protruding area 342*a*) of the second rotation member 342. For example, the third slot 344 may surround at least a portion of the first protruding area 341*a*, and the fourth slot 345 may surround at least a portion of the second protruding area 342*a*. According to an embodiment of the disclosure, the third slot 344 and/or the fourth slot 345 may be interpreted as a through-hole or groove extending in one direction. According to an embodiment of the disclosure, the rotation bracket 343 may not be coupled to the hinge cover 230. For example, the rotation bracket 343 may slide with respect to the hinge cover 230, based on the folding of the electronic device 200. According to an embodiment of the disclosure, the rotation structure 340 may be at least partially located at both ends of the hinge module 300. For example, the rotation bracket 343 may be at least partially located at both ends of the hinge module 300, and the rotation members 341 and 342 may be disposed between the connection structure 350 and the rotation bracket 343.

According to an embodiment of the disclosure, the connection structure 350 may connect a shaft structure (e.g., the first shaft structure 321 and/or the second shaft structure 322) to the hinge cover 230. According to one embodiment of the disclosure, the connection structure 350 may include a first connection member 351 connected to the first shaft structure 321 and a second connection member 352 connected to the second shaft structure 321. According to an embodiment of the disclosure, the first connection member 351 may be disposed between the first hinge arm 311 and the first rotation member 341. The second connection member 352 may be disposed between the second hinge arm 312 and the second rotation member 342. According to an embodiment of the disclosure, the connection structure 350 may be connected to the hinge cover 230.

According to an embodiment of the disclosure, the fixing structure 360 may position the first housing 210 and the second housing 220 at a certain angle. For example, the fixing structure 360 may provide pressure to the hinge arm 310 and/or the interlocking structure 330 in the longitudinal direction (e.g., the Y-axis direction) of the hinge module 300, thereby preventing or reducing movement and/or rotation of the first hosing 210 and/or the second housing 220. For example, when an external force of a predetermined value or more is applied by a user, the hinge module 300 may allow the first housing 210 and/or the second housing

220 to rotate, and when no external force is applied or an external force less than a predetermined value is applied, the first housing 210 and/or the second housing 220 may be maintained in a stationary state by using the fixing structure 360. According to an embodiment of the disclosure, at least a portion of the fixing structure 360 may be connected to the hinge cover 230. For example, a portion (e.g., the first region 360*a*) of the fixing structure 360 may be coupled to the hinge cover 230, and the other portion (e.g., the second region 360*b*) may be coupled to the interlocking structure 330. According to an embodiment of the disclosure, the fixing structure 360 may be disposed between the hinge arm 310 and the interlocking structure 330.

According to an embodiment of the disclosure, the fixing structure 360 may be connected to the shaft structure 320. For example, the fixing structure 360 may accommodate the shaft structure 320. According to an embodiment of the disclosure, the fixing structure 360 may include a first recess 365*a* that receives the first shaft structure 321, a second recess 365*b* that receives the second shaft structure 322, a third recess 365*c* that receives the third shaft structure 323, and a fourth recess 365*d* that receives the fourth shaft structure 324.

According to an embodiment of the disclosure, the fixing structure 360 may include cam members 361 and 362. According to an embodiment of the disclosure, the cam members 361 and 362 may include a first cam member 361 connected to the first hinge arm 311 by using the first shaft structure 321, and a second cam member 362 connected to the second hinge arm 312 by using the second shaft structure 322. According to an embodiment of the disclosure, the first cam member 361 may include a first cam area 361*a* located in the first area 360*a*, and a second cam area 361*b* facing the first cam area 361*a* and located in a second area 360*b*. According to an embodiment of the disclosure, the second cam member 362 may include a third cam area 362*a* located in the first area 360*a*, and a fourth cam area 362*b* facing the third cam area 362*a* and located in the second area 360*b*.

According to an embodiment of the disclosure, the fixing structure 360 may include elastic members 363 and 364. According to an embodiment of the disclosure, the elastic members 363 and 364 may include a first elastic member 363 connected to the first cam member 361 and the first interlocking member 331, and a second elastic member 364 connected to the second cam member 362 and the second interlocking member 332. According to an embodiment of the disclosure, the first elastic member 363 may provide an elastic force to the first hinge arm 311 and/or the first interlocking member 331 in the longitudinal direction (e.g., Y-axis direction) of the electronic device 200. The second elastic member 364 may provide an elastic force to the second hinge arm 312 and/or the first interlocking member 332 in the longitudinal direction (e.g., Y-axis direction) of the electronic device 200.

Figure 6B:
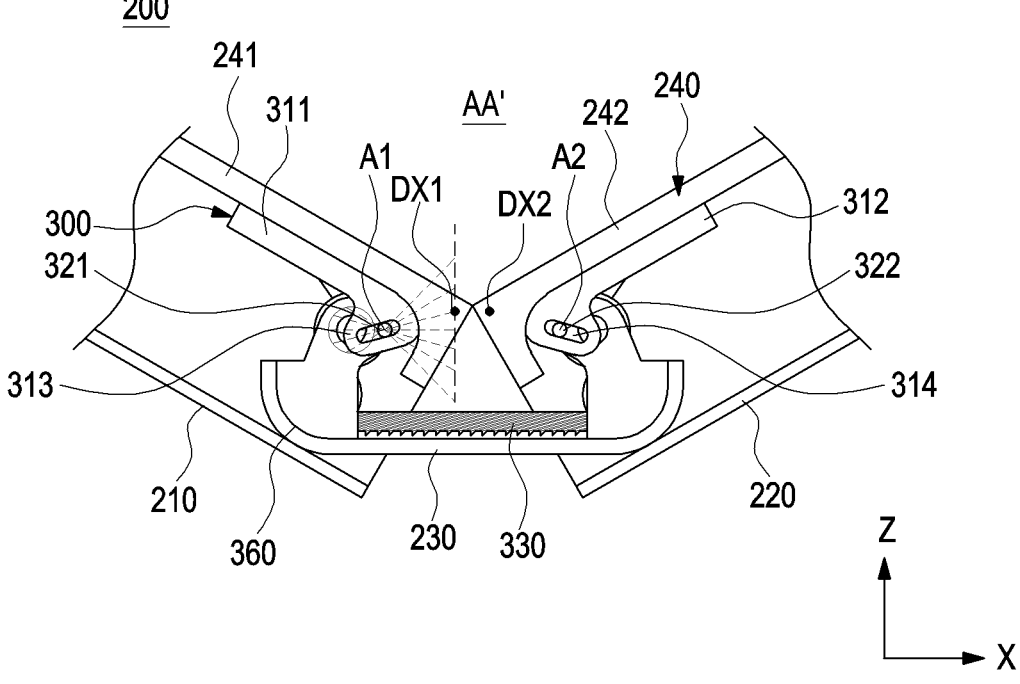
Figure 6C:
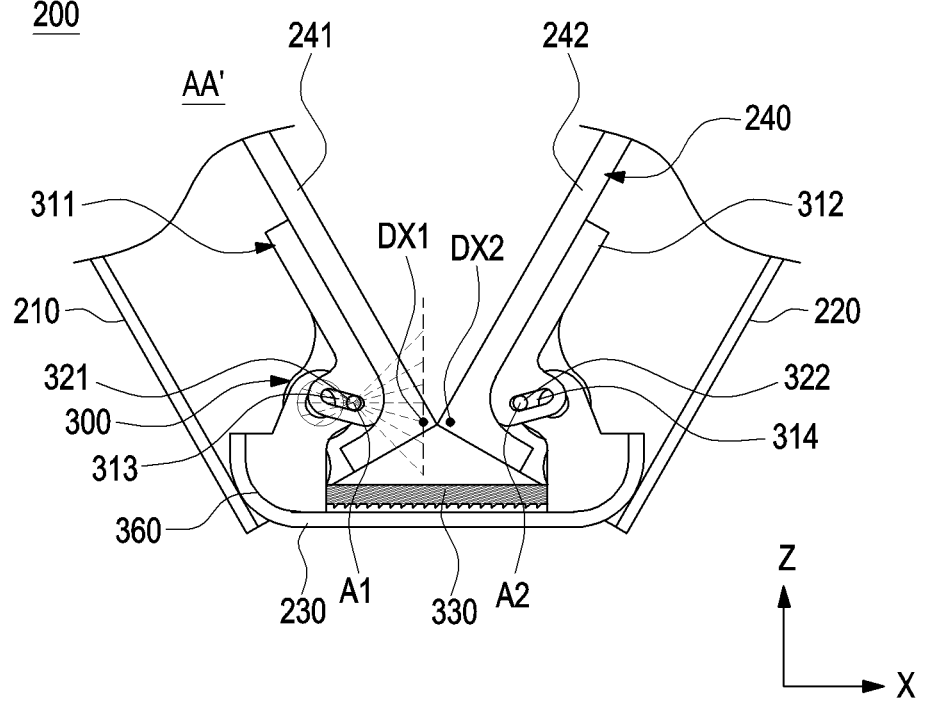

FIGS. 6A, 6B, and 6C are sectional views, taken along line A-A' of FIG. 4 according to various embodiments of the disclosure.

Figure 7B:
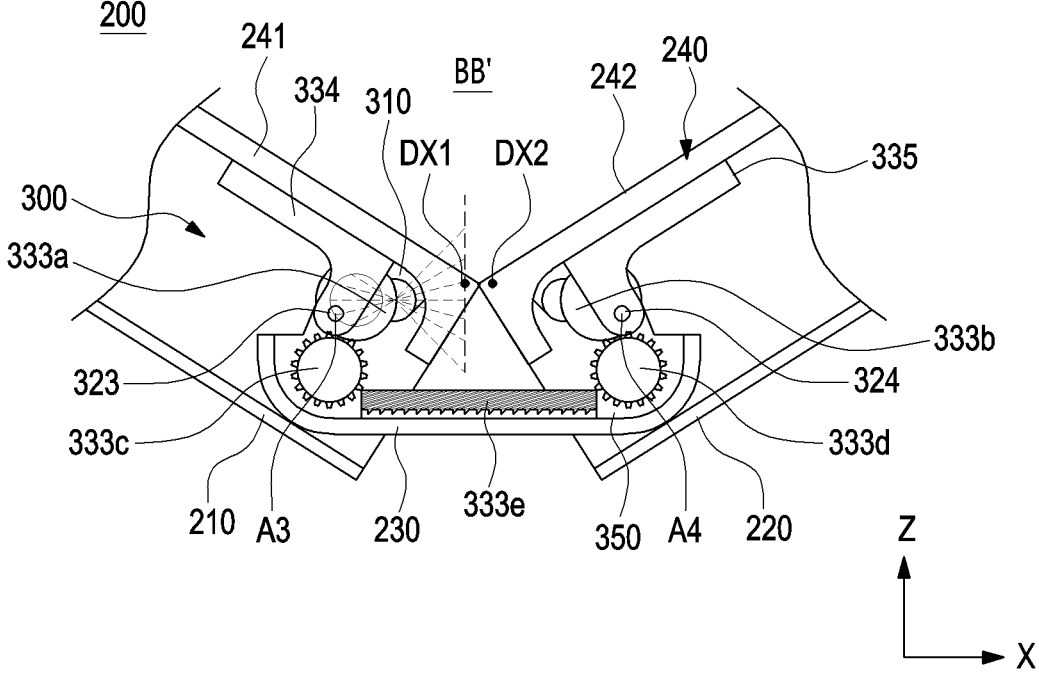
Figure 7C:
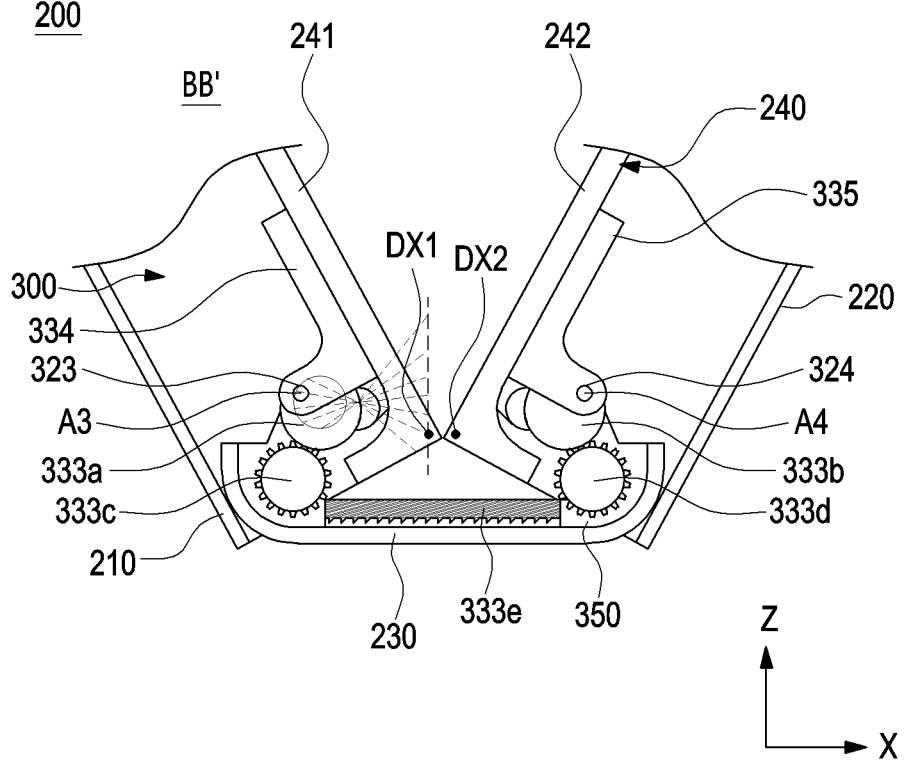

FIGS. 7A, 7B, and 7C are perspective views, taken along line B-B' of FIG. 4 according to various embodiments of the disclosure.

Figure 8A:
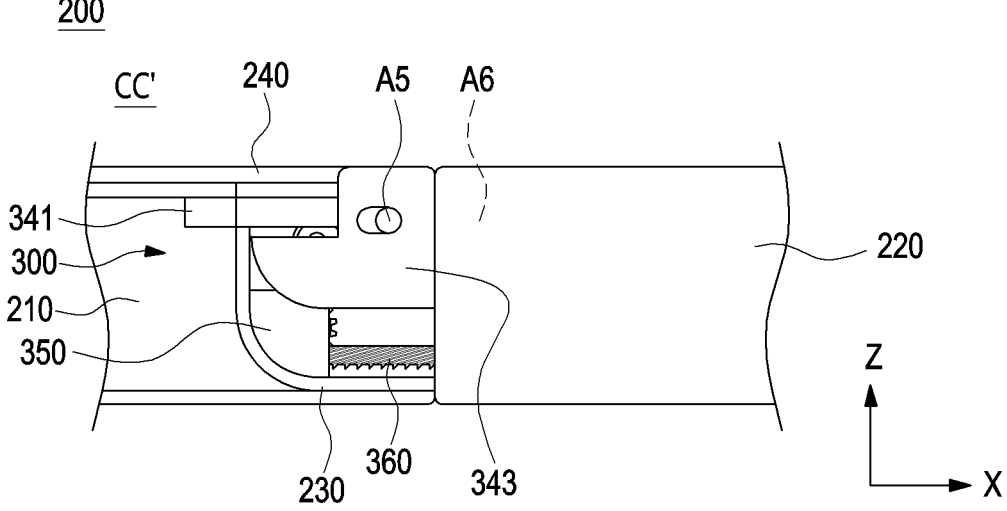
FIGS. 8A, 8B, and 8C are perspective views, taken along line C-C' of FIG. 4 according to various embodiments of the disclosure.
Figure 8B:
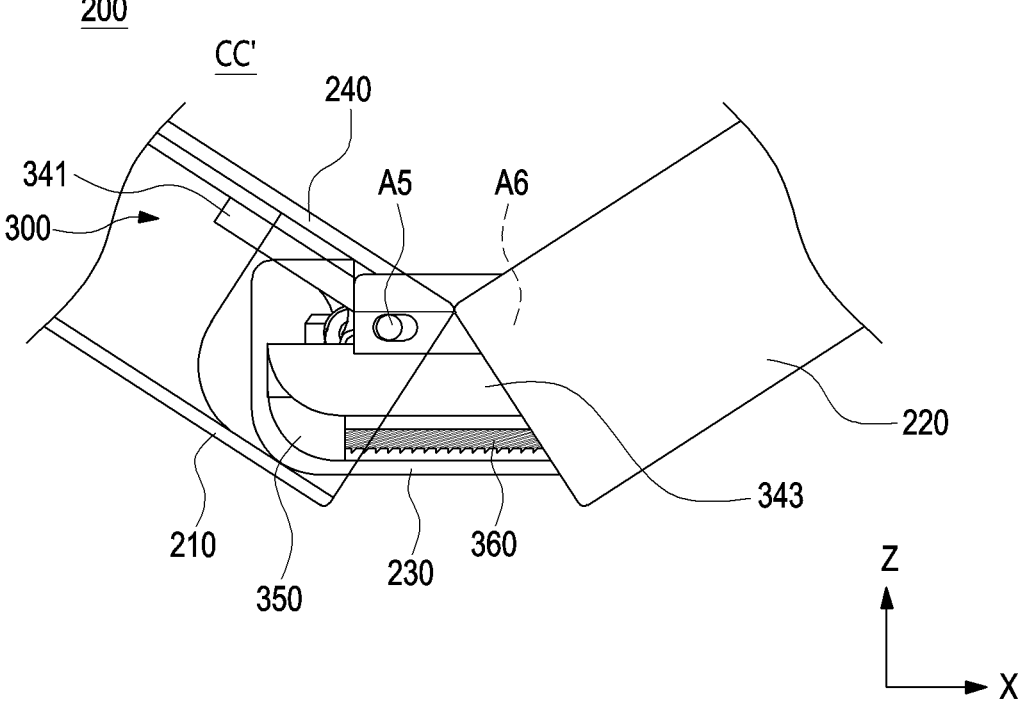
Figure 8C:
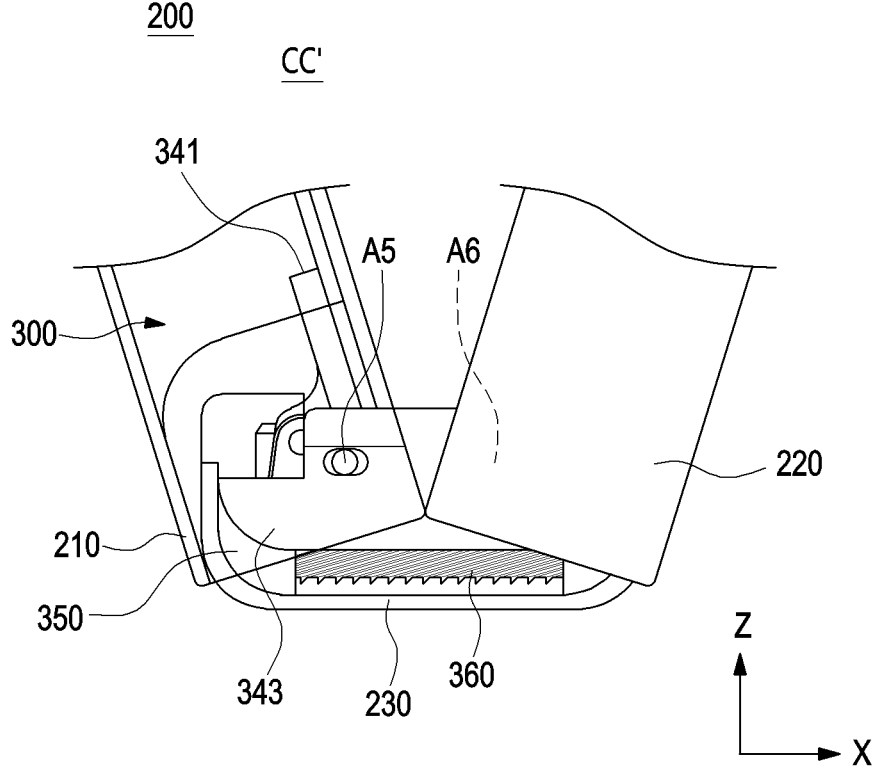

FIGS. 8A, 8B, and 8C are perspective views, taken along line C-C' of FIG. 4 according to various embodiments of the disclosure.

Figure 9A:
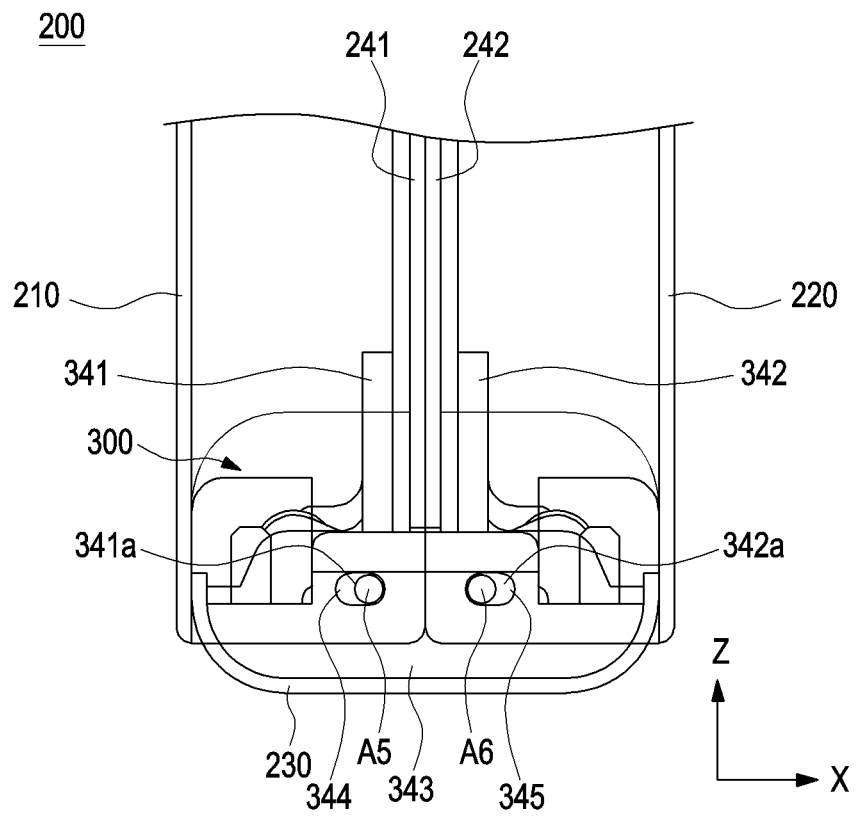
FIGS. 9A and 9B are projective views of the lateral surface of an electronic device according to various embodiments of the disclosure.
Figure 9B:
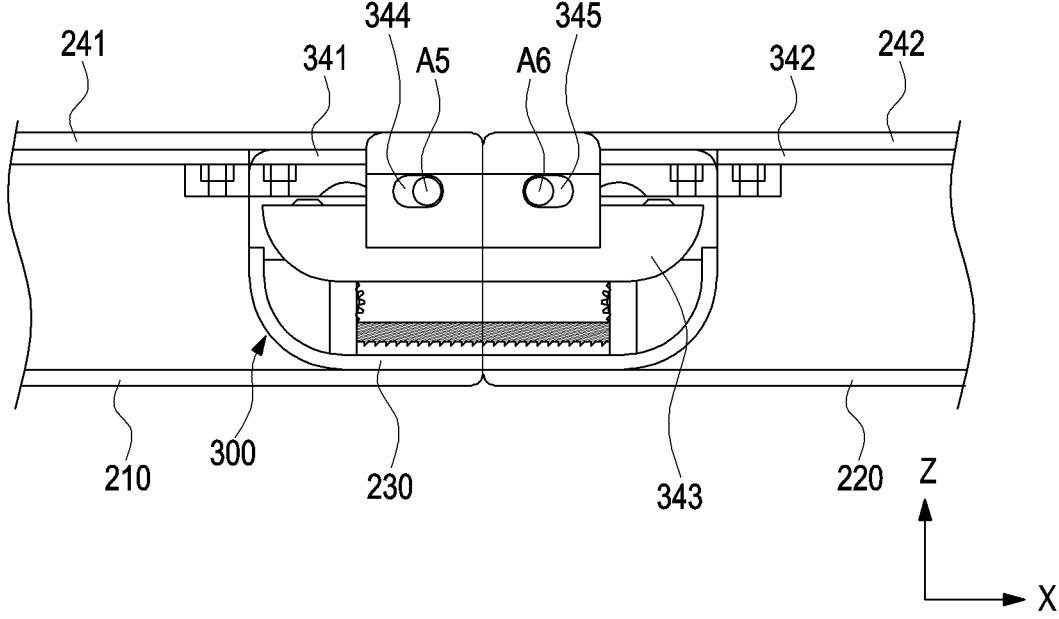

FIGS. 9A and 9B are projective views of the lateral surface of an electronic device according to various embodiments of the disclosure.

Figure 10:
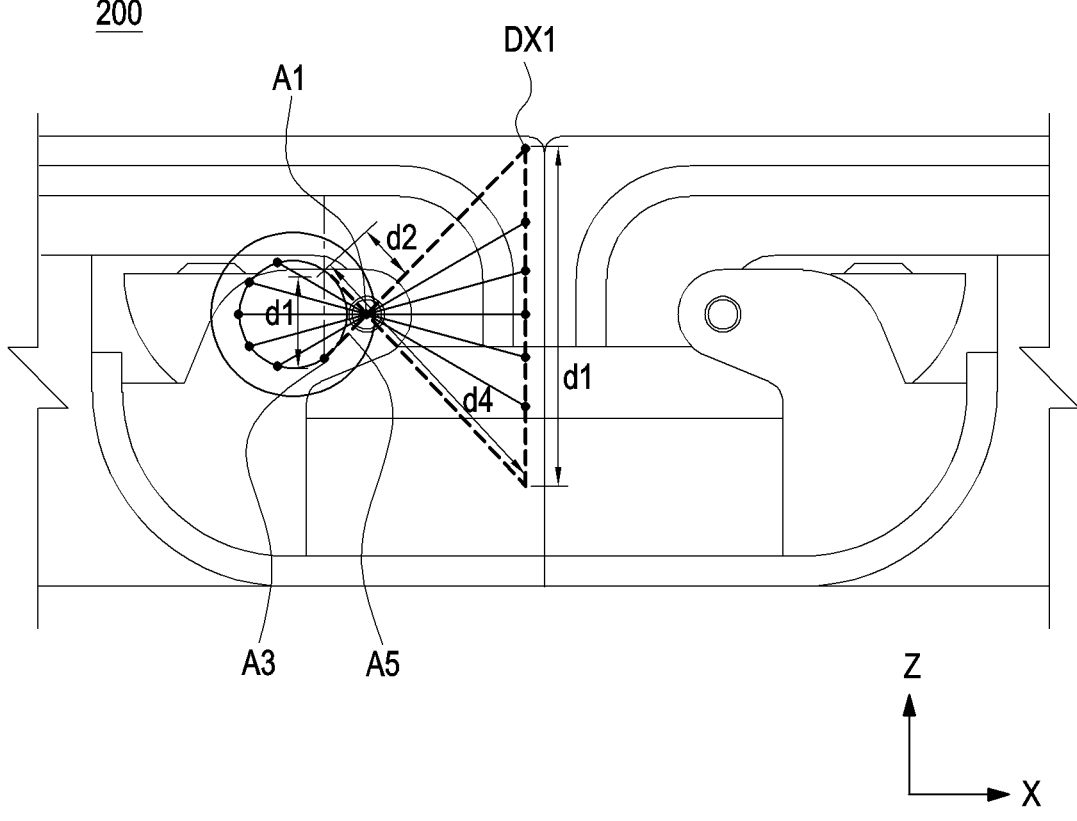
FIG. 10 is a sectional view of an electronic device to explain a rotation axis of the electronic device, according to an embodiment of the disclosure according to an embodiment of the disclosure.

FIG. 10 is a sectional view of an electronic device to explain a rotation axis of the electronic device, according to an embodiment of the disclosure.

Referring to FIGS. 6A to 6C, 7A to 7C, 8A to 8C, 9A, 9B, and 10, the electronic device 200 may include the first housing 210, the second housing 220, the hinge cover 230, the display 240, and the hinge module 300. The configuration of FIGS. 6A to 6C, 7A to 7C, 8A to 8C, 9A, 9B, and 10, including the first housing 210, the second housing 220, the hinge cover 230, the display 240, and the hinge module 300 may be partially or entirely the same as that of FIG. 4, including the first housing 210, the second housing 220, the hinge cover 230, the display 240, and hinge module 300.

According to an embodiment of the disclosure, at least a portion of the display 240 may rotate about a first display axis (DX1) and a second display axis (DX2). For example, the first display area 241 may rotate about the first display axis (DX1), and the second display area 242 may rotate about the second display axis (DX2). According to an embodiment of the disclosure, the first display axis (DX1) may be interpreted as a virtual axis located on the neutral plane of the first display area 241, and the second display axis (DX2) may be interpreted as a virtual axis located on the neutral plane of the second display area 242. According to an embodiment of the disclosure, the first housing 210 may rotate together with the first display area 241, and the second housing 220 may rotate together with the second display area 242.

According to an embodiment of the disclosure, the positions of the display axes (DX1 and DX2) may vary based on the change in an angle (e.g., folding) of the electronic device 200. According to an embodiment of the disclosure, as the angle between the first display area 241 and the second display area 242 of the electronic device 200 decreases, the display axes (DX1 and DX2) may move downward (e.g., −Z direction). For example, as the angle between the first display area 241 and the second display area 242 of the electronic device 200 decreases, the distance between the display axes (DX1 and DX2) and the hinge cover 230 may decrease.

According to an embodiment of the disclosure, a portion of the hinge module 300 may rotate using an axis (e.g., the first axis (A1), the second axis (A2), the third axis (A3), the fourth axis (A4), the fifth axis (A5), or the sixth axis (A6)). For example, at least a portion of the hinge module 300 may rotate based on the folding of the electronic device 200. According to an embodiment of the disclosure, another part of the hinge module 300 may be fixed to the hinge cover 230.

According to an embodiment (e.g., FIGS. 6A to 6C) of the disclosure, the hinge arm 310 may rotate about the first axis (A1) and the second axis (A2). According to an embodiment of the disclosure, the first hinge arm 311 may slide and rotate about the first axis (A1), and the second hinge arm 312 may slide and rotate about the second axis (A2).

According to an embodiment (e.g., FIGS. 7A to 7C) of the disclosure, at least a portion (e.g., rotation plates 334 and 335) of the interlocking structure 330, the third shaft structure 323, and the fourth shaft structure 324 may rotate based on the folding of the electronic device 200. For example, the first rotation plate 334 and the third shaft structure 323 may rotate together with the first housing 210 and/or the first display area 241 about the first display axis (DX1). The second rotation plate 335 and the fourth shaft structure 324 may rotate together with the second housing 220 and/or the second display area 242 about the second display axis (DX2). According to an embodiment of the disclosure, the distance between the third axis (A3) and the first display axis (DX1) may be maintained substantially unchanged, and the distance between the fourth axis (A4) and the second display axis (DX2) may be maintained substantially unchanged.

According to an embodiment (e.g., FIGS. 8A to 8C) of the disclosure, the rotation structure 340 may move based on the folding of the electronic device 200. According to an embodiment of the disclosure, the rotation members 341 and 342 may rotate while connected to the housings 210 and 220. For example, the first rotation member 341 may rotate about the fifth axis (A5), and the second rotation member (e.g., the second rotation member 342 of FIG. 5) may rotate about the sixth axis (A6). According to an embodiment of the disclosure, the first rotation member 341 may slide and rotate about the fifth axis (A5), and the second rotation member 342 may slide and rotate about the sixth axis (A6). According to an embodiment of the disclosure, the rotation bracket 343 may move with respect to the hinge cover 230, based on the folding of the electronic device 200. For example, the rotation bracket 343 may slide in a direction (e.g., the thickness direction (Z-axis direction) perpendicular to the hinge cover 230 of the electronic device 200). According to an embodiment of the disclosure, the second rotation member 342 may be symmetrical relative to the first rotation member 341.

According to an embodiment of the disclosure, the first shaft structure 321, the second shaft structure 322, the connection structure 350, and the fixing structure 360 may be connected to or fastened to the hinge cover 230 while being spaced apart from the hinge cover 230 by a specified distance.

According to an embodiment of the disclosure, a first distance (d1) may vary based on the change in an angle (e.g., folding) of the electronic device 200. According to an embodiment of the disclosure, the first distance (d1) may be interpreted as the distance between the display axes (DX1 and DX2) and the hinge cover 230.

According to an embodiment of the disclosure, the ratio of a second distance (d2) to the first distance (d1) may be substantially equal to the ratio of a third distance (d3) to the difference between a fourth distance (d4) and the third distance (d3). According to an embodiment of the disclosure, the third distance (d3) may be interpreted as the distance between the first axis (A1) and the third axis (A3) or the distance between the second axis (A2) and the fourth axis (A4). According to an embodiment of the disclosure, the fourth distance (d4) may be interpreted as the distance between the first display axis (DX1) and the third axis (A3) or the distance between the second display axis (DX2) and the fourth axis (A4). According to an embodiment of the disclosure, the second distance (d2) may be interpreted as $\sqrt{2}$ times the third distance (d3). For example, the first distance (d1) may satisfy Equation 1 below.

$$d1 = \sqrt{2}\,(d4 - d3) \qquad \text{Equation 1}$$

According to various embodiments of the disclosure, the third distance (d3) may vary based on the change in an angle (e.g., folding) of the electronic device 200. For example, by sliding the first hinge arm 311 and/or the second hinge arm 312 relative to the first shaft structure 321 and/or the second shaft structure 322, the third distance (d3) may vary based on the change in an angle of the electronic device 200. According to an embodiment of the disclosure, the fourth distance (d4) may maintain a specified value. The first distance (d1) may vary based on the third distance (d3).

Figure 11A:
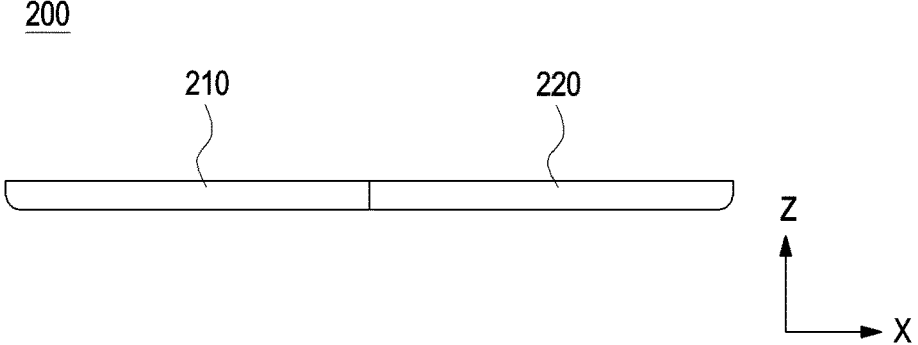
FIGS. 11A, 11B, and 11C are side views of an electronic device according to various embodiments of the disclosure.
Figure 11B:
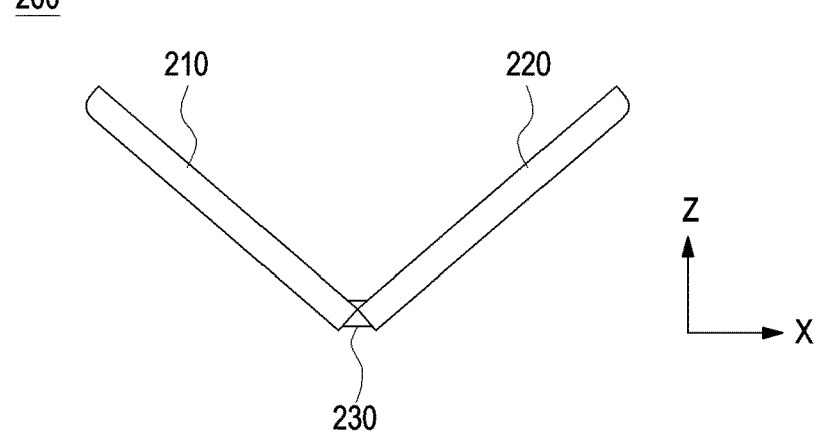
Figure 11C:
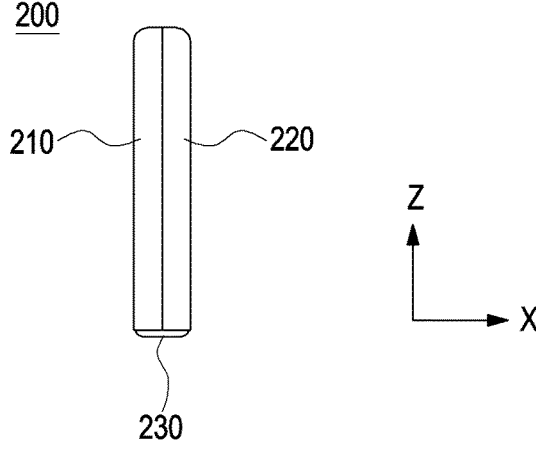

FIGS. 11A, 11B, and 11C are side views of an electronic device according to various embodiments of the disclosure.

For example, FIG. 11A is a side view of the electronic device 200 in an unfolded state according to an embodiment of the disclosure, FIG. 11B is a side view of the electronic device 200 in an intermediate state according to an embodiment of the disclosure, and FIG. 11C is a side view of the electronic device 200 in a fully folded state according to an embodiment of the disclosure.

Figure 12A:
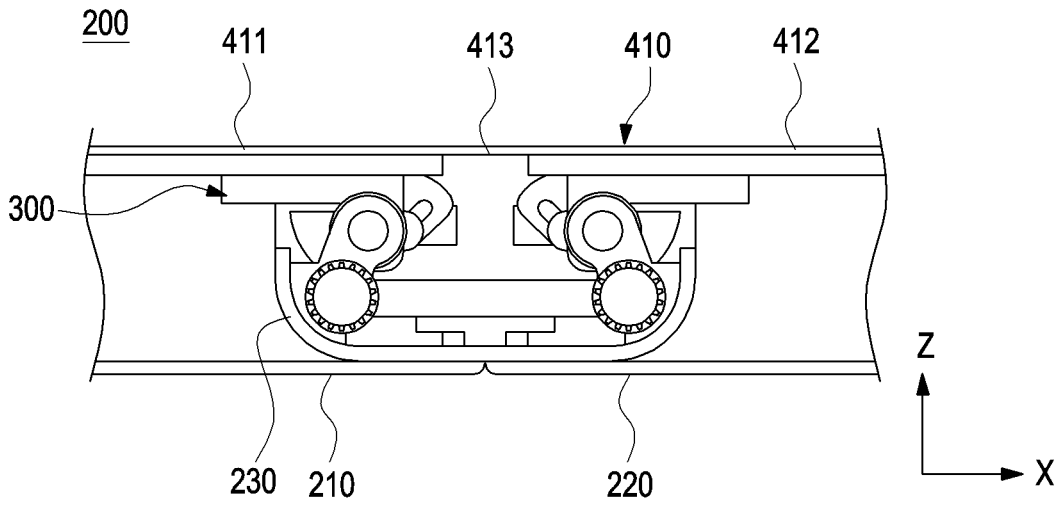
FIGS. 12A, 12B, and 12C are sectional views of an electronic device including a flexible display, according to various embodiments of the disclosure.
Figure 12B:
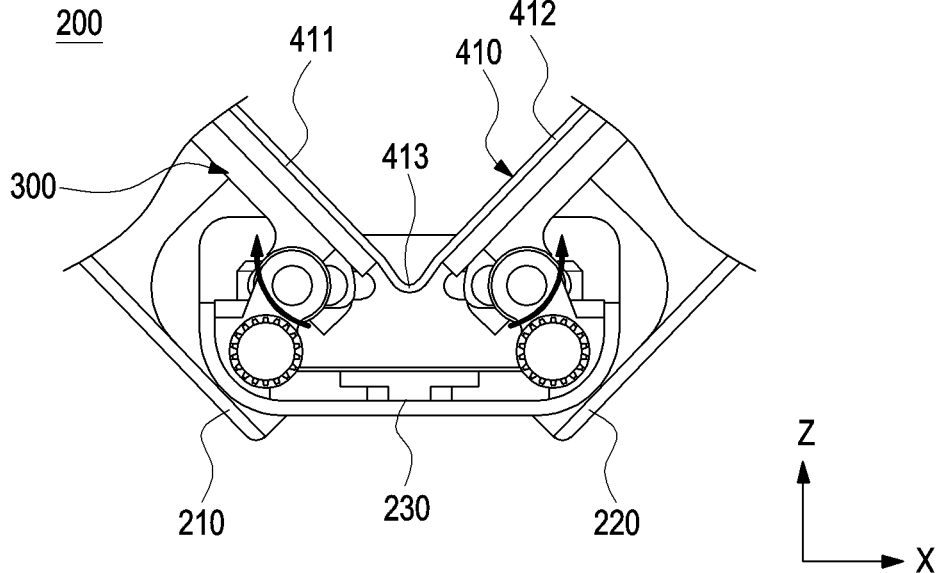
Figure 12C:
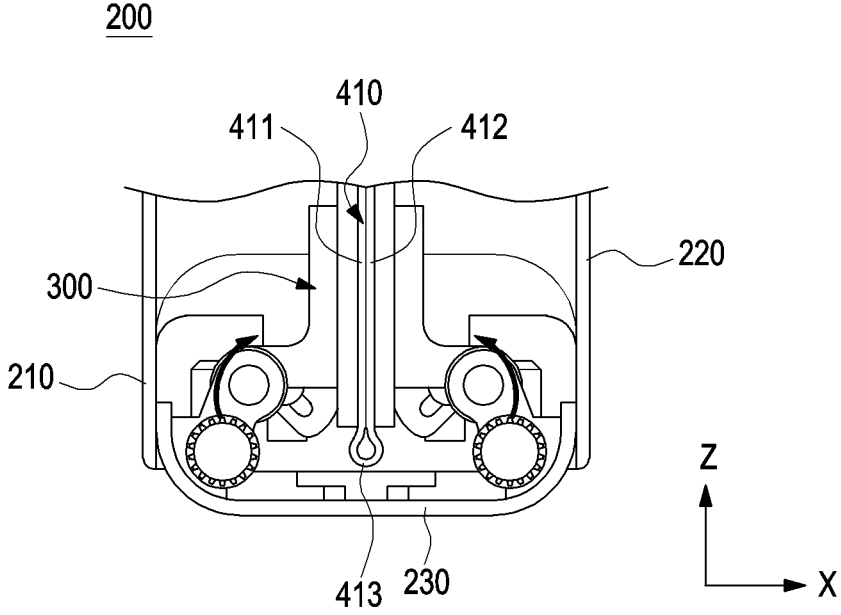

FIGS. 12A, 12B, and 12C are sectional views of an electronic device including a flexible display, according to various embodiments of the disclosure.

For example, FIG. 12A is a sectional view of the electronic device of FIG. 11A, according to an embodiment of the disclosure, FIG. 12B is a sectional view of the electronic device of FIG. 11B, according to an embodiment of the disclosure, and FIG. 12C is a sectional view of the electronic device of FIG. 11C, according to an embodiment of the disclosure.

Referring to FIGS. 11A to 11C and 12A to 12C, the electronic device 200 may include the housings 210 and 220, the hinge cover 230, the hinge module 300, and the display 410. The configurations of FIGS. 11A to 11C and 12A to 12C, including the housings 210 and 220, the hinge cover 230, the hinge module 300, and the display 410 may be partially or entirely the same as that of FIG. 3, including the housings 210 and 220, the hinge cover 230, the hinge module 202, and the display 240.

According to an embodiment of the disclosure, the display 410 may include a first display area 411 (e.g., the first display area 241 of FIG. 3), a second display area 412 (e.g., the second display area 242 of FIG. 3), and a folding area 413 (e.g., the folding area 243 of FIG. 3) located between the first display area 411 and the second display area 412. According to an embodiment of the disclosure, when the electronic device 200 is in a folded state (e.g., FIGS. 11C and 12A to 12C), the first display area 411 may face the second display area 412, and the folding area 413 may move toward the hinge cover 230. For example, the folding area 243 may not face the first display area 411 and/or the second display area 412 when the electronic device 200 is in a folded state.

According to an embodiment of the disclosure, when the electronic device 200 is in a folded state, at least a portion of the hinge cover 230 may overlap the first housing 210 and/or the second housing 220.

Figure 13A:
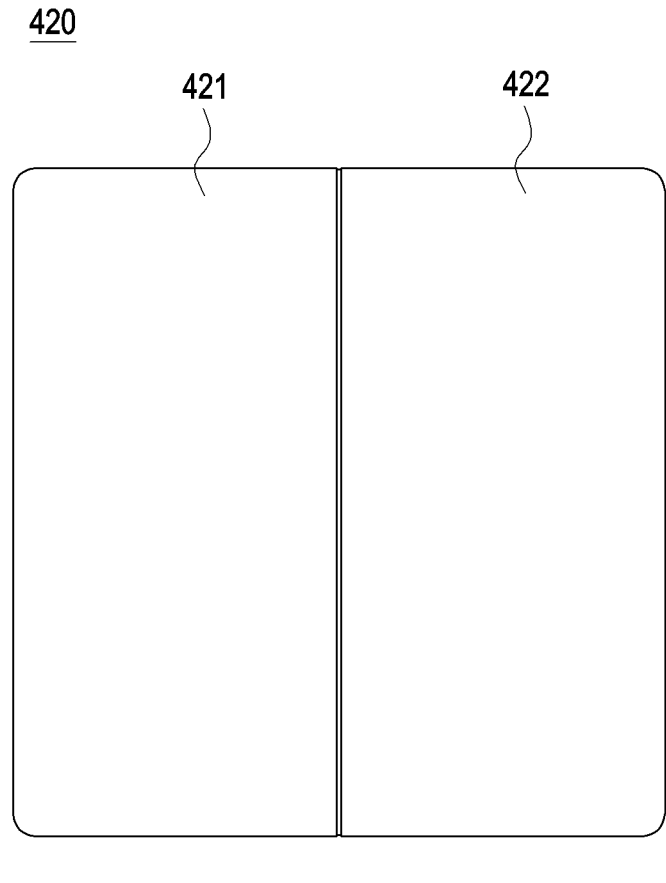
FIGS. 13A and 13B are a front view and a side view of a dual display, respectively, according to various embodiments of the disclosure.
Figure 13B:
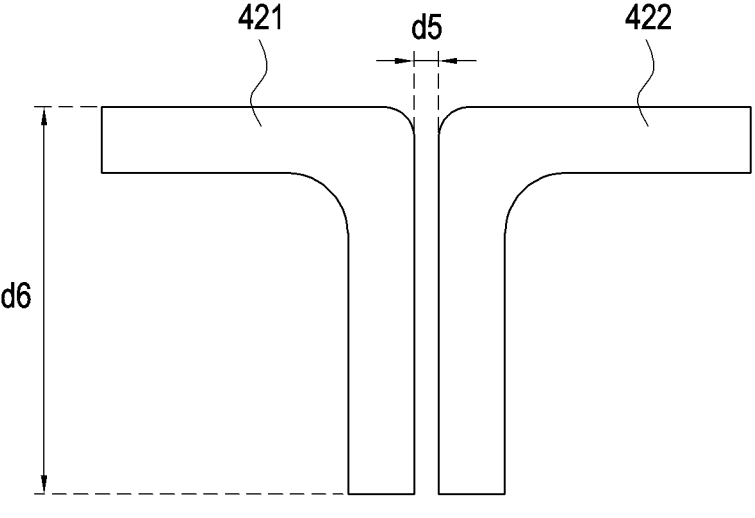

FIGS. 13A and 13B are a front view and a side view of a dual display, respectively, according to various embodiments of the disclosure.

Figure 14A:
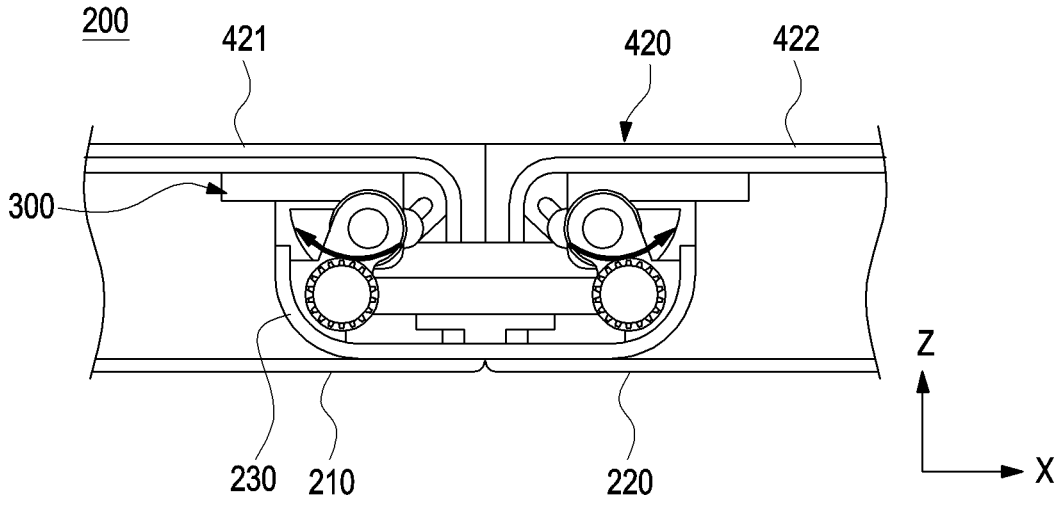
FIGS. 14A, 14B, and 14C are sectional views of an electronic device including a dual display, according to various embodiments of the disclosure.
Figure 14B:
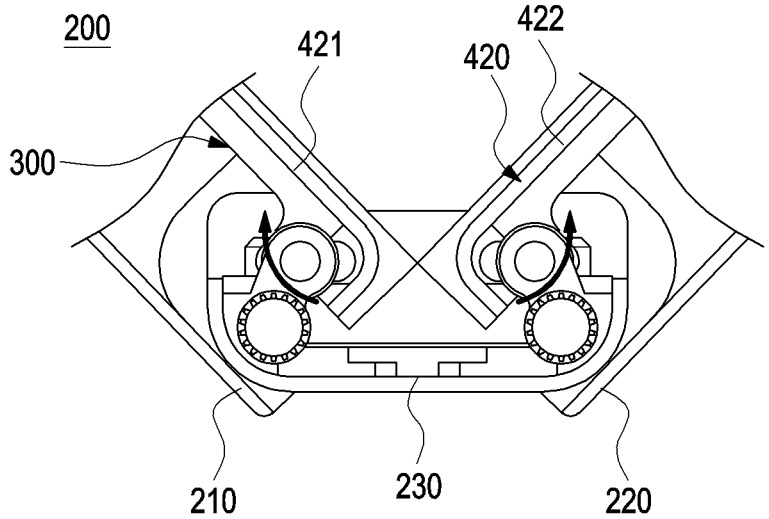
Figure 14C:
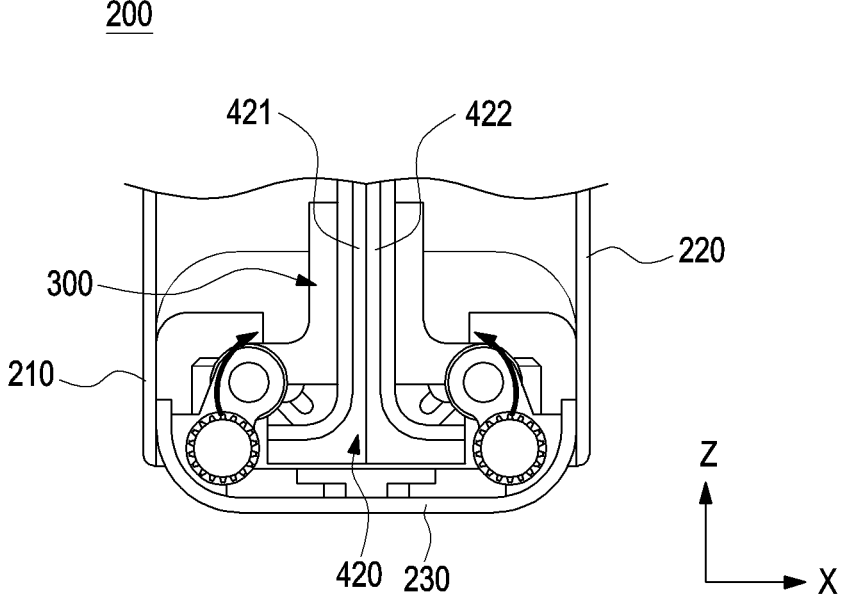

FIGS. 14A, 14B, and 14C are sectional views of an electronic device including a dual display, according to various embodiments of the disclosure.

For example, FIG. 14A is a sectional view of the electronic device of FIG. 11A, according to an embodiment of the disclosure, FIG. 14B is a sectional view of the electronic device of FIG. 11B, according to an embodiment of the disclosure, and FIG. 14C is a sectional view of the electronic device of FIG. 11C, according to an embodiment of the disclosure.

Referring to FIGS. 13A, 13B, and 14A to 14C, the electronic device 200 may include the housings 210 and 220, the hinge cover 230, the hinge module 300, and the display 420. The configurations of FIGS. 13A, 13B, and 14A to 14C, including the housings 210 and 220, the hinge cover 230, the hinge module 300, and the display 420 may be partially or entirely the same as that of FIG. 3, including the housings 210 and 220, the hinge cover 230, the hinge module 202, and the display 240.

According to an embodiment of the disclosure, the display 420 may include the first display area 421 and the second display area 422 which are spaced apart from each other. For example, the first display area 421 may be a separate display spaced apart from the second display area 422. For example, the display 420 may not include a folding area (e.g., the folding area 413 of FIG. 12C) located between the first display area 421 and the second display area 422. According to an embodiment of the disclosure, the first display area 421 and the second display area 422 may be rigid displays physically separated from each other. According to an embodiment of the disclosure, the display 420 may be interpreted as a dual display. According to an embodiment of the disclosure, the first display area 421 and the second display area 422 may be rotated substantially by 90 degrees. For example, the hinge module 300 may rotate the first display area 421 and the second display area 422 substantially by 90 degrees until the electronic device 200 in an unfolded state (e.g., FIG. 11A) transitions to the electronic device 200 in a fully folded state (e.g., FIG. 11C).

According to an embodiment of the disclosure, the bending depth (d6) of the display 420 may be increased by rotating the first display area 421 and the second display area 422 substantially by 90 degrees. For example, the bending depth (d6) of the electronic device 200 including the hinge module 300 according to the disclosure may be longer than the bending length of the electronic device 200 including another hinge module. According to an embodiment of the disclosure, a fifth distance (d5) between the first display area 421 and the second display area 422 may be reduced. According to an embodiment of the disclosure, the radius of curvature of the display areas 421 and 422 may be reduced.

Electronic devices (e.g., portable terminals) include displays that have a flat surface or a flat and curved surface. Electronic devices including displays may have limitations in implementing a screen larger than the size of the electronic device due to the fixed structure of the displays. Therefore, foldable electronic devices are being researched.

There may be difficulties in ensuring mechanical stability while allowing the structures of an electronic device to move (e.g., rotate) relative to each other. For example, it may be difficult to secure a stable operating structure in a foldable electronic device while ensuring portability of the electronic device through miniaturization.

An embodiment of the disclosure may provide an electronic device which may prevent the formation of a space between the hinge cover and the housing and reduce the degree of protrusion of the hinge cover by moving the display axis when the electronic device is folded.

However, the technical solutions of the disclosure are not limited to the above-mentioned solutions, and may be expanded in various ways without departing from the spirit and scope of the disclosure.

The electronic device according to an embodiment of the disclosure may use a hinge arm rotatable and slidable within a slot to move a display rotation axis in the direction of a hinge cover when the electronic device is folded. The movement of the display rotation axis in the direction of the hinge cover may prevent the formation of a space between the hinge cover and the housing and reduce the protrusion of the hinge cover.

According to an embodiment of the disclosure, an electronic device (e.g., electronic device 200 of FIG. 1) may include a housing (e.g., the housing 201 of FIG. 1) including a first housing (e.g., the first housing 210 of FIG. 1) and a second housing configured to rotate with respect to the first housing (e.g., the second housing 220 of FIG. 1), a display (e.g., the display 240 of FIG. 1) including a first display area (e.g., the first display area 241 of FIG. 1) disposed on the first housing, and a second display area (e.g., the second display area 242 of FIG. 1) disposed on the second housing, a hinge module (e.g., the hinge module 300 of FIG. 4) connected to the first housing and the second housing, and a hinge cover configured to surround at least a portion of the hinge module (e.g., the hinge cover 230 of FIG. 4), wherein the hinge module may include a hinge arm (e.g., the hinge arm 310 of FIG. 5) including a first hinge arm (e.g., the first hinge arm 311 of FIG. 5) connected to the first housing and including a first slot (e.g., the first slot 313 of FIG. 5) and a second hinge arm (e.g., the second hinge arm 312 of FIG. 5) connected to the second housing and including a second slot (e.g., the second slot 314 of FIG. 5), a shaft structure (e.g., the shaft structure 320 of FIG. 5) including, as a shaft structure connected to the hinge cover, a first shaft structure (e.g., the first shaft structure 321 of FIG. 5) at least partially located within the first slot and providing a first axis, and a second shaft structure (e.g., the second shaft structure 322 of FIG. 5) at least partially located within the second slot and providing a second axis, and an interlocking structure (e.g., the interlocking structure 330 of FIG. 5) including a first interlocking member (e.g., the first interlocking member 331 of FIG. 5) connected to the first housing and including a first gear (e.g., the first gear 333a of FIG. 5) and a second interlocking member (the second interlocking member 332 of FIG. 5) connected to the second housing and including a second gear (e.g., the second gear 333b of FIG. 5) configured to rotate based on the rotation of the first gear.

According to an embodiment of the disclosure, the shaft structure may include a third shaft structure (e.g., the third shaft structure 323 of FIG. 5) connected to the first interlocking member and providing a third axis (e.g., the third axis (A3) of FIG. 7A), and a fourth shaft structure (e.g., the fourth shaft structure 324 of FIG. 5) connected to the second interlocking member and providing a fourth axis (e.g., the fourth axis (A4) of FIG. 7A) parallel to the third axis.

According to an embodiment of the disclosure, the first interlocking member may be configured to rotate about the third axis, the second interlocking member may be configured to rotate about the fourth axis, the first display area may be configured to rotate about a first display axis (e.g., the first display axis (DX1) of FIG. 6A), the second display area may be configured to rotate about a second display axis (e.g., the second display axis (DX2) of FIG. 6A), the first axis may be located between the first display axis and the third axis, and the second axis may be located between the second display axis and the fourth axis.

According to an embodiment of the disclosure, the interlocking structure may include a first rotation plate (e.g., the first rotation plate 334 of FIG. 5) connected to the first housing, and a second rotation plate (e.g., the second rotation plate 335 of FIG. 5) connected to the second housing.

According to an embodiment of the disclosure, the hinge module may include a rotation structure (e.g., the rotation structure 340 of FIG. 5) including a first rotation member (e.g., the first rotation member 341 of FIG. 5) connected to the first housing, a second rotation member (e.g., the second rotation member 342 of FIG. 5) connected to the second housing, and a rotation bracket (e.g., the rotation bracket 343 of FIG. 5) connected to the hinge cover and accommodating the first rotation member and the second rotation member.

According to an embodiment of the disclosure, the rotation bracket may include a third slot (e.g., the third slot 344 of FIG. 5) and a fourth slot (e.g., the fourth slot 345 of FIG. 5), wherein the first rotation member may include a first protruding area (e.g., the first protruding area 341*a* of FIG. 5) located within the third slot and a second protruding area (e.g., the second protruding area 342*a* of FIG. 5) located within the fourth slot, and the first rotation member and the second rotation member may be configured to rotate and slide with respect to the rotation bracket.

According to an embodiment of the disclosure, the interlocking structure may include, as a gear assembly connected to the hinge cover, a gear assembly including a third gear (e.g., the third gear 333*c* of FIG. 5) connected to the first gear, a fourth gear (e.g., the fourth gear 333*d* of FIG. 5) connected to the second gear, and a fifth gear (e.g., the fifth gear 333*e* of FIG. 5) connected to the third gear and the fourth gear, the third gear, the fourth gear, and the fifth gear may be helical gears, the first interlocking member may be configured to rotate with respect to the center of the third gear, and the second interlocking member may be configured to rotate with respect to the center of the fourth gear.

According to an embodiment of the disclosure, the hinge module may include a connection structure (e.g., the connection structure 350 of FIG. 5) including a first connection member (e.g., the first connection member 351 of FIG. 5) including a first through-hole (e.g., a first through-hole 353 of FIG. 5) configured to accommodate the first shaft structure, and a second connection member (e.g., the second connection member 352 of FIG. 5) including a second through-hole (e.g., the second through-hole 354 of FIG. 5) configured to accommodate the second shaft structure, wherein the first connection member and the second connection member may be connected to the hinge cover.

According to an embodiment of the disclosure, the hinge module may include, as a fixing structure located between the hinge arm and the interlocking structure, a fixing structure (e.g., the fixing structure 360 of FIG. 5) configured to provide elastic force to at least one of the hinge arm or the interlocking structure.

According to an embodiment of the disclosure, the fixing structure may include a first cam member (e.g., the first cam member 361 of FIG. 5) connected to the first shaft structure and the first interlocking member and a second cam member (e.g., the second cam member 362 of FIG. 5) connected to the second shaft structure and the second interlocking member.

According to an embodiment of the disclosure, the fixing structure may include a first elastic member (e.g., the first elastic member 363 of FIG. 5) located between the first cam member and the first interlocking member, and a second elastic member (e.g., the second elastic member 364 of FIG. 5) located between the second cam member and the second interlocking member.

According to an embodiment of the disclosure, when the electronic device is folded, at least a portion of the hinge cover may overlap with at least a portion of the housing.

According to an embodiment of the disclosure, the display may include, as a folding area located between the first display area and the second display area, a folding area (e.g., the folding area 243 of FIG. 3 or the folding area 413 of FIG. 12C) at least partially facing at least a portion of the hinge module.

According to an embodiment of the disclosure, the first display area and the second display area may be separated from each other.

According to an embodiment of the disclosure, the electronic device may further include a substrate including a first circuit board (e.g., the first circuit board 262 of FIG. 3) disposed in the first housing, a second circuit board (e.g., the second circuit board 264 of FIG. 3) disposed in the second housing, and a flexible circuit board (e.g., the flexible circuit board 266 of FIG. 3) configured to electrically connect the first circuit board and the second circuit board to each other.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a housing comprising a first housing and a second housing configured to rotate relative to the first housing;
a first display disposed on the first housing;
a second display disposed on the second housing and physically distinct from the first display, wherein a first edge of the first display and a second edge of the second display are adjacent to each other, and wherein the first display and the second display face each other in a folded state of the electronic device and face a same direction in an unfolded state of the electronic device;
a hinge module connected to the first housing and the second housing; and
a hinge cover configured to surround at least a portion of the hinge module,
wherein the hinge module comprises:
a hinge arm comprising a first hinge arm connected to the first housing and comprising a first slot, and a second hinge arm connected to the second housing and comprising a second slot,
a shaft structure connected to the hinge cover, the shaft structure comprising a first shaft structure at least partially located within the first slot and providing a first axis, and a second shaft structure at least partially located within the second slot and providing a second axis, and
an interlocking structure comprising a first interlocking member connected to the first housing and comprising a first gear, and a second interlocking member connected to the second housing and comprising a second gear configured to rotate based on rotation of the first gear,
wherein the first hinge arm is configured to slide and rotate about the first axis, based on a folding angle of the electronic device, and
wherein the second hinge arm is configured to slide and rotate about the second axis, based on the folding angle of the electronic device.

2. The electronic device of claim 1, wherein the shaft structure comprises:
a third shaft structure connected to the first interlocking member and providing a third axis; and
a fourth shaft structure connected to the second interlocking member and providing a fourth axis parallel to the third axis.

3. The electronic device of claim 2,
wherein the first display is configured to rotate with respect to a first display axis, and
wherein the second display is configured to rotate with respect to a second display axis, the first axis is located between the first display axis and the third axis, and the second axis is located between the second display axis and the fourth axis.

4. The electronic device of claim 1, wherein the interlocking structure comprises:
a first rotation plate connected to the first housing; and
a second rotation plate connected to the second housing.

5. The electronic device of claim 1, wherein the hinge module comprises:
a rotation structure comprising:
a first rotation member connected to the first housing,
a second rotation member connected to the second housing, and
a rotation bracket connected to the hinge cover and accommodating the first rotation member and the second rotation member.

6. The electronic device of claim 5,
wherein the rotation bracket comprises a third slot and a fourth slot,
wherein the first rotation member comprises a first protruding area located within the third slot and a second protruding area located within the fourth slot, and
wherein the first rotation member and the second rotation member are configured to rotate and slide relative to the rotation bracket.

7. The electronic device of claim 1,
wherein the interlocking structure comprises a gear assembly connected to the hinge cover, the gear assembly comprising a third gear connected to the first gear, a fourth gear connected to the second gear, and a fifth gear connected to the third gear and the fourth gear,
wherein the third gear, the fourth gear, and the fifth gear are helical gears,
wherein the first interlocking member is configured to rotate with respect to a center of the third gear, and
wherein the second interlocking member is configured to rotate with respect to a center of the fourth gear.

8. The electronic device of claim 1,
wherein the hinge module comprises a connection structure comprising:
a first connection member comprising a first through-hole accommodating the first shaft structure, and
a second connection member comprising a second through-hole accommodating the second shaft structure, and

wherein the first connection member and the second connection member are connected to the hinge cover.

9. The electronic device of claim 1, wherein the hinge module comprises a fixing structure located between the hinge arm and the interlocking structure, the fixing structure configured to provide an elastic force to at least one of the hinge arm or the interlocking structure.

10. The electronic device of claim 9, wherein the fixing structure comprises:
a first cam member connected to the first shaft structure and the first interlocking member; and
a second cam member connected to the second shaft structure and the second interlocking member.

11. The electronic device of claim 10, wherein the fixing structure comprises:
a first elastic member located between the first cam member and the first interlocking member; and
a second elastic member located between the second cam member and the second interlocking member.

12. The electronic device of claim 1, wherein, while the electronic device is folded, at least a portion of the hinge cover is overlapped with at least a portion of the housing.

13. The electronic device of claim 1, further comprising:
a substrate part comprising:
a first circuit board disposed in the first housing,
a second circuit board disposed in the second housing, and
a flexible circuit board configured to electrically connect the first circuit board and the second circuit board.

14. The electronic device of claim 2,
wherein the first interlocking member is rotatably coupled to the third axis which is misaligned to a center of the first gear, and
wherein the second interlocking member is rotatably coupled to the fourth axis which is misaligned to a center of the second gear.

15. The electronic device of claim 3, wherein as the folding angle between the first display and the second display of the electronic device decreases, a second distance between both the first display axis and the second display axis and the hinge cover decreases.

* * * * *